United States Patent
Khine et al.

(10) Patent No.: US 9,522,820 B2
(45) Date of Patent: Dec. 20, 2016

(54) PROCESSES FOR RAPID MICROFABRICATION USING THERMOPLASTICS AND DEVICES THEREOF

(75) Inventors: Michelle Khine, Irvine, CA (US);
Chi-shuo Chen, Merced, CA (US);
Anthony Grimes, Merced, CA (US);
David Nate Breslauer, Berkeley, CA (US); Luke Lee, Orinda, CA (US);
Michael Dunlap, Merced, CA (US);
Ajay Gopinathan, Merced, CA (US);
Sayantani Ghosh, Merced, CA (US)

(73) Assignee: The Regents of the University of California, Oakland, CA (US)

( * ) Notice: Subject to any disclaimer, the term of this patent is extended or adjusted under 35 U.S.C. 154(b) by 1089 days.

(21) Appl. No.: 12/742,598

(22) PCT Filed: Nov. 12, 2008

(86) PCT No.: PCT/US2008/083283
§ 371 (c)(1),
(2), (4) Date: Feb. 2, 2011

(87) PCT Pub. No.: WO2009/064816
PCT Pub. Date: May 22, 2009

(65) Prior Publication Data
US 2011/0122406 A1    May 26, 2011

Related U.S. Application Data

(60) Provisional application No. 61/003,113, filed on Nov. 13, 2007, provisional application No. 61/018,881, filed on Jan. 3, 2008.

(51) Int. Cl.
*C25F 3/00*    (2006.01)
*B81C 1/00*    (2006.01)
(Continued)

(52) U.S. Cl.
CPC ........ *B81C 1/00071* (2013.01); *B01F 5/0057* (2013.01); *B01F 5/0646* (2013.01);
(Continued)

(58) Field of Classification Search
CPC .. B82Y 40/00; G03F 7/0002; H01L 21/02263; H01L 21/02269; H01L 21/02271
(Continued)

(56) References Cited

U.S. PATENT DOCUMENTS 4,470,415 A    9/1984  Wozniak
4,596,728 A    6/1986  Yang et al.
(Continued)

FOREIGN PATENT DOCUMENTS

WO    WO 2007011331 A2 *   1/2007
WO    WO 2010/085751 A2    7/2010
(Continued)

OTHER PUBLICATIONS

Andrew, et al. 2004 "Energy transfer across a metal film mediated by surface plasmon polaritons" *Science* 306: 1002-1005.
(Continued)

*Primary Examiner* — Binh X Tran
(74) *Attorney, Agent, or Firm* — Knobbe, Martens, Olson & Bear, LLP

(57) ABSTRACT

A method is provided to prepare one or more microfluidic channels on a receptive material by applying an image-forming material to a heat sensitive thermoplastic receptive material in a designed pattern and heating the material under conditions that reduce the size of the thermoplastic receptive material by at least about 60%. In an alternative aspect, the microfluidic channels on receptive material are prepared by etching a designed pattern into a heat sensitive thermoplastic material support and then heating the material under condi-
(Continued)

Fabrication steps:

1. Thin film Metal deposition

2. Heat

3. Spin coat fluorescent molecules (organic dye, quantum dots)

Uni-axial
 ⇔

Biaxial (Isotropic)
 ⇔ tions that reduce the size of the thermoplastic receptive material by at least about 60%.

9 Claims, 17 Drawing Sheets

(51) Int. Cl.
    *B01F 5/00*         (2006.01)
    *B01F 5/06*         (2006.01)
    *B01F 13/00*       (2006.01)
    *B01L 3/00*         (2006.01)
    *H01L 21/02*       (2006.01)
    *B82Y 40/00*       (2011.01)

(52) U.S. Cl.
    CPC ........ *B01F 5/0647* (2013.01); *B01F 13/0059* (2013.01); *B01L 3/502707* (2013.01); *H01L 21/02271* (2013.01); *B01L 2300/0816* (2013.01); *B01L 2300/0887* (2013.01); *B81B 2201/058* (2013.01); *B81B 2203/0338* (2013.01); *B82Y 40/00* (2013.01); *H01L 21/02269* (2013.01)

(58) Field of Classification Search
    USPC ................... 216/11, 18, 54, 55, 56; 422/502
    See application file for complete search history.

(56) References Cited

U.S. PATENT DOCUMENTS

| | | | |
|---|---|---|---|
| 5,079,273 | A | 1/1992 | Kuroda et al. |
| 5,418,136 | A | 5/1995 | Miller |
| 5,842,787 | A | 12/1998 | Kopf-Sill et al. |
| 5,937,758 | A | 8/1999 | Maracas |
| 6,319,469 | B1 | 11/2001 | Mian et al. |
| 6,376,619 | B1 | 4/2002 | Halverson et al. |
| 6,395,483 | B1 | 5/2002 | Patil et al. |
| 6,482,638 | B1 | 11/2002 | Patil |
| 6,517,977 | B2 | 2/2003 | Resnick et al. |
| 6,548,607 | B2 | 4/2003 | Halverson et al. |
| 6,573,338 | B2 | 6/2003 | Halverson et al. |
| 6,593,089 | B2 | 7/2003 | Patil |
| 6,664,060 | B2 | 12/2003 | Patil |
| 6,783,838 | B2 | 8/2004 | Coleman et al. |
| 6,792,856 | B2 | 9/2004 | Hall et al. |
| 6,841,258 | B2 | 1/2005 | Halverson et al. |
| 6,868,786 | B2 | 3/2005 | Fujihira et al. |
| 6,869,735 | B2 | 3/2005 | Tamada |
| 6,881,538 | B1 | 4/2005 | Haddad et al. |
| 6,913,931 | B2 | 7/2005 | Halverson et al. |
| 6,926,864 | B2 | 8/2005 | Peeters et al. |
| 6,981,445 | B2 | 1/2006 | Cracauer et al. |
| 7,033,667 | B2 | 4/2006 | Voss-Kehl et al. |
| 7,189,842 | B2 | 3/2007 | Halverson et al. |
| 7,362,524 | B2 | 4/2008 | Nakamura et al. |
| 7,382,449 | B2 | 6/2008 | Peterman et al. |
| 7,412,926 | B2 | 8/2008 | Sakurai et al. |
| 8,828,302 | B2 * | 9/2014 | Khine et al. ............... 264/342 R |
| 2002/0146745 | A1 | 10/2002 | Natan et al. |
| 2002/0176804 | A1 | 11/2002 | Strand et al. |
| 2003/0180191 | A1 | 9/2003 | Suzuki et al. |
| 2004/0258885 | A1 | 12/2004 | Kreutter et al. |
| 2006/0141259 | A1* | 6/2006 | Voss-Kehi et al. ........ 428/411.1 |
| 2007/0008390 | A1 | 1/2007 | Cruchon-Dupeyrat et al. |
| 2008/0049323 | A1* | 2/2008 | Sugiyama et al. ............ 359/500 |
| 2011/0122406 | A1 | 5/2011 | Khine et al. |
| 2012/0027807 | A1 | 2/2012 | Chien et al. |
| 2012/0064627 | A1 | 3/2012 | Khine et al. |
| 2012/0129208 | A1 | 5/2012 | Khine et al. |
| 2012/0129209 | A1 | 5/2012 | Khine et al. |
| 2012/0202702 | A1 | 8/2012 | Khine et al. |
| 2013/0040335 | A1 | 2/2013 | Khine et al. |
| 2013/0101795 | A1 | 4/2013 | Khine et al. |
| 2013/0309450 | A1 | 11/2013 | Khine et al. |

FOREIGN PATENT DOCUMENTS

| | | |
|---|---|---|
| WO | WO 2012/115658 A1 | 8/2010 |
| WO | WO 2010/108025 A2 | 9/2010 |
| WO | WO 2010/132610 A2 | 11/2010 |
| WO | WO 2010/132611 A2 | 11/2010 |
| WO | WO 2010/132612 A2 | 11/2010 |
| WO | WO 2011/028579 A2 | 3/2011 |
| WO | WO 2013/063406 A1 | 5/2013 |

OTHER PUBLICATIONS

Anker, et al. 2008 "Biosensing with plasmonic nanosensors" *Nature Materials* 7: 442-453.
Au, et al. 2009 "Cell culture chips for simultaneous application of topographical and electrical cues enhance phenotype of cardiomyocytes" *Lab Chip* 9: 564-575.
Au, et al 2007 "Interactive effects of surface topography and pulsatile electrical field stimulation on orientation and elongation of fibroblasts and cardiomyocytes" *Biomaterials* 28(29): 4277-4293.
Aubin, et al. 2003 "Characterization of the mixing quality in micromixers" *Chem. Eng. Technol* 26(12): 1262-1270.
Barnes, et al. 2004 "Surface Plasmon Polaritons and Their Role in the Enhanced Transmission of Light through Periodic Arrays of Subwavelength Holes in a Metal Film" *Physical Review Letters* 92(10): 1-4.
Bettinger, et al. 2009 "Engineering Substrate Micro- and Nanotopography to Control Cell Function" *Angew Chem Int Ed Engl.* 48(30): 5406-5415.
Bowden, et al. 1998 "Spontaneous formation of ordered structures in thin films of metals supported on an elastomeric polymer" *Nature* 393: 146-149.
Bowden, et al. 1999 "The controlled formation of ordered, sinusoidal structures by plasma oxidation of an elastomeric polymer" *Applied Physics Letters* 75(17): 2557-2559.
Burke, et al. 2003 "Stopped-Flow Enzyme Assays on a Chip Using a Microfabricated Mixer" *Anal Chem* 75: 1786-1791.
Campbell, et al. 2004 "Microfluidic mixers: from microfabricated to self-assembling devices" *Phil Trans R Soc Lond* 362: 1069-1086.
Cerda, et al. 2002 "Wrinkling of an elastic sheet under tension" *Nature* 419: 579-580.
Chao, et al. 2007 "Rapid fabrication of microchannels using microscale plasma activated templating (μPLAT) generated water molds" *Lab Chip* 7: 641-643.
Chen, et al. 1997 "Geometric Control of Cell Life and Death" *Science* 276: 1425-1428.
Chen, et al. 2011 "Shrink-Film Confi gurable Multiscale Wrinkles for Functional Alignment of Human Embryonic Stem Cells and their Cardiac Derivatives" *Advanced Materials* 23: 5785-5791.
Chen, et al. 2008 "Shrinky-Dink microfluidics: 3D polystyrene chips" *Lab Chip* 8: 622-624.
Cole 2006 "Optimized plasmonic nanoparticle distributions for solar spectrum harvesting" *Applied Physics Letters* 89: 1-3.
Coyne, et al. 2008 "A simple method for derivatizing the surface of silica gel with aldehyde groups by employing a new alkoxy aldehyde silane" *UCT, Inc.*: 1-15.
Dalby, et al. 2007 "Nanomechanotransduction and Interphase Nuclear Organization Influence on Genomic Control" *Journal of Cellular Biochemistry* 102: 1234-1244.
Dalby, et al. 2003 "Nucleus alignment and cell signaling in fibroblasts: response to a micro-grooved topography" *Experimental Cell Research* 284: 274-282.
Dalby, et al. 2007 "The control of human mesenchymal cell differentiation using nanoscale symmetry and disorder" *Nature Materials* 6: 997-1003.
Dertinger, et al. 2001 "Generation of Gradients Having Complex Shapes Using Microfluidic Networks" *Anal Chem* 73: 1240-1246.
Duffy, et al. 1998 "Rapid Prototyping of Microfluidic Systems in Poly(dimethylsiloxane)" *Anal Chem* 70: 4974-4984.
Ebbesen, et al. 1998 "Extraordinary optical transmission through sub-wavelength hole arrays" *Nature* 391: 667-669.

(56) References Cited

OTHER PUBLICATIONS

Efimenko, et al. 2009 "Development and Testing of Hierarchically Wrinkled Coatings for Marine Antifouling" *Applied Materials* 1(5): 1031-1040.
Engelmayr, et al. 2008 "Accordion-Like Honeycombs for Tissue Engineering of Cardiac Anisotropy" *Nat Mater* 7(12): 1003-1010.
Engler, et al. 2006 "Matrix Elasticity Directs Stem Cell Lineage Specification" *Cell* 126: 677-689.
Fromstein, et al. 2008 "Seeding Bioreactor-Produced Embryonic Stem Cell-Derived Cardiomyocytes on Different Porous, Degradable, Polyurethane Scaffolds Reveals the Effect of Scaffold Architecture on Cell Morphology" *Tissue Engineering* 14(3): 369-378.
Fu, et al. 2009 "Tunable Nanowrinkles on Shape Memory Polymer Sheets" *Advanced Materials* 21: 4472-4476.
Gerecht, et al. 2007 "The effect of actin disrupting agents on contact guidance of human embryonic stem cells" *Biomaterials* 28(28): 4068-4077.
Grimes, et al. 2008 "Shrinky-Dink microfluidics: rapid generation of deep and rounded patterns" *Lab Chip* 8: 170-172.
Gryczynski, et al. 2005 "Surface-Plasmon-Coupled Emission of Quantum Dots" *J. Phys. Chem* 109: 1088-1093.
Haubert, et al. 2006 "PDMS bonding by means of a portable, low-cost corona system" *Lab Chip* 6: 1548-1549.
Hellman, et al. 2007 "Laser-Induced Mixing in Microfluidic Channels" *Anal Chem* 79: 4484-4492.
Huang, et al. 2004 "Evolution of wrinkles in hard films on soft substrates" *Physical Review* 70: 1-4.
Huck, et al. 2000 "Ordering of Spontaneously Formed Buckles on Planar Surfaces" *Langmuir* 16: 3497-3501.
Jiang, et al. 2004 "Compatibility of Mammalian Cells on Surfaces of Poly(dimethylsiloxane)" *Langmuir* 20: 11684-11691.
Jiang, et al. 2002 "Controlling Mammalian Cell Spreading and Cytoskeletal Arrangement with Conveniently Fabricated Continuous Wavy Features on Poly(dimethylsiloxane)" *Langmuir* 18: 32733280.
Junkar, et al. 2010 "Influence of oxygen and nitrogen plasma treatment on polyethylene terephthalate (PET) polymers" *Vacuum* 84: 83-85.
Kim, et al. 2010 "Nanoscale cues regulate the structure and function of macroscopic cardiac tissue constructs" *PNAS* 107(2): 565-570.
Kuzyk, et al. 2007 "Molecular coupling of light with plasmonic waveguides" *Optics Express* 15(16): in 10 pages.
Lacour, et al. 2003 "Stretchable gold conductors on elastomeric substrates" *Applied Physics Letters* 82(15): 2404-2406.
Laflamme, et al. 2007 "Cardiomyocytes derived from human embryonic stem cells in pro-survival factors enhance function of infarcted rat hearts" *Nature Biotechnology* 25(9): 1015-1024.
Lago, et al. 2004 "Microfluidic devices obtained by thermal toner transferring on glass substrate" *Electrophoresis* 25: 3825-3831.
Lam, et al. 2008 "Reversible on-demand cell alignment using reconfigurable microtopography" *Biomaterials* 29(11): 1705-1712.
Lin, et al. 2004 "Effective neutrophil chemotaxis is strongly influenced by mean IL-8 concentration" *Biochemical and Biophysical Research Communications* 319: 576-581.
Lin, et al. 2005 "A rapid three-dimensional vortex micromixer utilizing self-rotation effects under low Reynolds number conditions" *J. Micromech. Microeng* 15: 935-943.
Liu, et al. 2000 "Passive Mixing in a Three-Dimensional Serpentine Microchannel" *Journal of Microelectromechanical Systems* 9(2): 190- 197.
Liu, et al. 2002 "Bubble-induced acoustic micromixing" *Lab Chip* 2: 151-157.
Liu, et al. 2005 "Rapid method for design and fabrication of passive micromixers in microfluidic devices using a direct-printing process" *Lab Chip* 5: 974-978.
Liu, et al. 2007 "Interaction of CdSe/ZnS quantum dots: Among themselves and with matrices" *Microelectronics Journal* 38: 700-705.

Luna, et al. 2011 "Multiscale Biomimetic Topography for the Alignment of Neonatal and Embryonic Stem Cell-Derived Heart Cells" *Tissue Engineering* 17(5): 579-588.
Maier, et al. 2005 "Plasmonics: Localization and guiding of electromagnetic energy in metal/dielectric structures" *Journal of Applied Physics* 98: 1-10.
Maltezos, et al. 2007 "Design and fabrication of chemically robust three-dimensional microfluidic valves" *Lab Chip* 7: 1209-1211.
Mandon, et al. 2010 "Polyshrink™ based microfluidic chips and protein microarrays" *Biosensors and Bioelectronics* 26: 1218-1224.
McBeath, et al. 2004 "Cell Shape, Cytoskeletal Tension, and RhoA Regulate Stem Cell Lineage Commitment" *Developmental Cell* 6: 483-495.
McDonald, et al. 2002 "Prototyping of Microfluidic Devices in Poly(dimethylsiloxane) Using Solid-Object Printing" *Anal Chem* 74: 1537-1545.
McNamara, et al. 2010 "Nanotopographical Control of Stem Cell Differentiation" *Journal of Tissue Engineering*: 1-13.
Morfa, et al. 2008 "Plasmon-enhanced solar energy conversion in organic bulk heterojunction photovoltaics" *Applied Physics Letters* 92: in 3 pages.
Mukhopadhyay 2007 "When PDMS isn't the best. What are its weaknesses, and which other polymers can researchers add to their toolboxes?" *Anal Chem* 79(9): 3248-3253.
Murray, et al. 2004 "Transition from localized surface plasmon resonance to extended surface plasmon-polariton as metallic nanoparticles merge to form a periodic hole array" *Physical Review* 69: 1-7.
Murtuza, et al. 2009 "Micro- and Nanoscale Control of the Cardiac Stem Cell Niche for Tissue Fabrication" *Tissue Engineering* 15(4): 443-454.
Nathan, et al. 2011 "Mechano-topographic modulation of stem cell nuclear shape on nanofibrous scaffolds" *Acta Biomaterialia* 7: 57-66.
Nguyen, et al. 2010 "Better shrinkage than Shrinky-Dinks" *Lab Chip* 10: 1623-1626.
Nguyen, et al. 2005 "Micromixers—a review" *J. Micromech. Microeng* 15: R1-R16.
Nie, et al. 1997 "Probing Single Molecules and Single Nanoparticles by Surface-Enhanced Raman Scattering" *Science* 275: 1102-1106.
Niu, et al. 2006 "Active microfluidic mixer chip" *Applied Physics Letters* 88: 1-3.
Oddy, et al. 2001 "Electrokinetic Instability Micromixing" *Anal Chem* 73: 5822-5832.
Okamoto, et al. 2006 "Surface-plasmon enhanced bright emission from CdSe quantum-dot nanocrystals" *J. Opt. Soc. Am B* 23(8): 1674-1678.
Ottino, et al. 2004 "Designing Optimal Micromixers" *Science* 305: 485-486.
Pagliari, et al. 2011 "Cooperation of Biological and Mechanical Signals in Cardiac Progenitor Cell Differentiation" *Advanced Materials* 23: 514-518.
Pajerowski, et al. 2007 "Physical plasticity of the nucleus in stem cell differentiation" *PNAS* 104(40): 15619-15624.
Pins, et al. 1997 "Self-Assembly of Collagen Fibers. Influence of Fibrillar Alignment and Decorin on Mechanical Properties" *Biophysical Journal* 73: 2164-2172.
Raether, et al. 1988 "Surface plasmons on smooth and rough surfaces and on gratings" Springer-Verlag, Berlin (in 142 pages).
Ryu, et al. 2004 "Micro magnetic stir-bar mixer integrated with parylene microfluidic channels" *Lab Chip* 4: 608-613.
Soliman, et al. 2010 "Multiscale three-dimensional scaffolds for soft tissue engineering via multimodal electrospinning" *Acta Biomaterialia* 6: 1227-1237.
Song, et al. 2005 "Large Enhancement of Fluorescence Efficiency from CdSe/ZnS Quantum Dots Induced by Resonant Coupling to Spatially Controlled Surface Plasmons" *Nano Letters* 5(8): 1557-1561.
Stafford, et al. 2004 "A buckling-based metrology for measuring the elastic moduli of polymeric thin films" *Nature Materials* 3: 545-550.

(56) References Cited

OTHER PUBLICATIONS

Stevens, et al. 2009 "Physiological function and transplantation of scaffold-free and vascularized human cardiac muscle tissue" *PNAS* 106(39): 16568-16573.
Stone, et al. 2004 "Engineering flows in small devices: Microfluidics toward a lab-on-a-chip" *Annu. Rev. Fluid Mech* 36: 381-411.
Stremler, et al. 2004"Designing for chaos: applications of chaotic advection at the microscale" *Phil. Trans. R. Soc. Lond* 362: 1019-1036.
Stroock, et al. 2002 "Chaotic Mixer for Microchannels" *Science* 295: 647-651.
Sudarsan, et al. 2006 "Multivortex micromixing" *PNAS* 103(19): 7228-7233.
Tan, et al. 2001 "Rapid fabrication of microfluidic devices in poly(dimethylsiloxane) by photocopying" *Lab Chip* 1: 7-9.
Tan, et al. 2004 "Bionanotechnology Based on SilicaNanoparticles" *Medicinal Research Reviews* 24(5): 621-638.
Taylor, et al. 2010 "Shrink film patterning by craft cutter: complete plastic chips with high resolution/high-aspect ratio channel" *Lab Chip* 10: 2472-2475.
Tessier, et al. 2006 "Improved surface sensing of DNA on gas-etched porous silicon" *Sensors and Actuators* B 120: 220-230.
Thomson, et al. 1998 "Embryonic Stem Cell Lines Derived from Human Blastocysts" *Science* 282: 1145-1147.
Toepke, et al. 2006 "PDMS absorption of small molecules and consequences in microfluidic applications" *Lab Chip* 6: 1484-1486.
Unger, et al. 2000 "Monolithic Microfabricated Valves and Pumps by Multilayer Soft Lithography" *Science* 288: 113-116.
Van Der Meer. Et al. 2010 "Analyzing shear stress-induced alignment of actin filaments in endothelial cells with a microfluidic assay" *Biomicrofluidics* 4: 1-5.
Vijayendran, et al. 2003 "Evaluation of a Three-Dimensional Micromixer in a Surface-Based Biosensor" *Langmuir* 19: 1824-1828.
Voldman, et al. 1999 "Microfabrication in Biology and Medicine" *Annu Rev Biomed Eng* 01: 401-425.
Volle, et al. 2003 "Enhanced sensitivity detection of protein immobilization by fluorescent interference on oxidized silicon" *Biosensors and Bioelectronics* 19: 457-464.
Volynskii, et al. 2000 "Mechanical buckling instability of thin coatings deposited on soft polymer substrates" *Journal of Materials Science* 35: 547-554.
Vullev, et al. 2006 "Nonlithographic Fabrication of Microfluidic Devices" *J Am Chem Soc* 128: 16062-16072.
Watanabe, et al. 2004 "Polypyrrole Film with Striped Pattern" *J Polym Sci* 42: 2460-2466.
Watanabe, et al. 2005 "Striped-Pattern Formation of a Thin Gold Film Deposited onto a Stretched Elastic Silicone Substrate" *J Polym Sci* 43: 1532-1537.
Watt, et al. 1988 "Cell shape controls terminal differentiation of human epidermal keratinocytes" *Proc Natl Aced Sci* 85: 5576-5580.
Whitesides, et al. 2001 "Soft lithography in biology and biochemistry" *Annu Rev Biomed Eng* 3: 335-373.
Xia, et al. 1998 "Soft Lithography" *Annu Rev Mater Sci* 28: 153-184.
Xia, et al. 2005 "Chaotic micromixers using two-layer crossing channels to exhibit fast mixing at low Reynolds numbers" *Lab Chip* 5: 748-755.
Xu, et al. 2001 "Feeder-free growth of undifferentiated human embryonic stem cells" *Nature Biotechnology* 19: 971-974.
Xu, et al. 1999 "Spectroscopy of Single Hemoglobin Molecules by Surface Enhanced Raman Scattering" *Physical Review Letters* 83(21): 4357-4360.
Xue, et al. 2005 "Functional Integration of Electrically Active Cardiac Derivatives From Genetically Engineered Human Embryonic Stem Cells With Quiescent Recipient Ventricular Cardiomyocytes" *Circulation* 111: 11-20.
Yager, et al. 2006 "Microfluidic diagnostic technologies for global public health" *Nature* 442: 412-418.
Yang, et al. 2008 "Human cardiovascular progenitor cells develop from a KDR+embryonic-stem-cellderived population" *Nature* 453: 524-528.
Yim, et al. 2010 "Nanotopography-induced changes in focal adhesions, cytoskeletal organization, and mechanical properties of human mesenchymal stem cells" *Biomaterials* 31: 1299-1306.
Yoo, et al. 2002 "Physical self-assembly of microstructures by anisotropic buckling" *Adv Mater* 14(19): 1383-1387.
Zheng, et al. 2007 "Silica Colloidal Crystals for Enhanced Fluorescence Detection in Microarrays" *Anal Chem* 79: 3867-3872.

\* cited by examiner

A)

B)

A)

PROCESSES FOR RAPID MICROFABRICATION USING THERMOPLASTICS AND DEVICES THEREOF

CROSS REFERENCE TO RELATED APPLICATIONS

The present application is a national stage application under 35 U.S.C. §371 of International Application No. PCT/US2008/083283, filed Nov. 12, 2008, which in turn claims the benefit under 35 U.S.C. §119(e) of U.S. Provisional Ser. No. 61/003,113, filed Nov. 13, 2007 and U.S. Provisional Ser. No. 61/018,881, filed Jan. 3, 2008, the contents of each of which are hereby incorporated by reference into the present disclosure.

FIELD OF THE INVENTION

The invention disclosed herein related to the field of microfabrication.

BACKGROUND OF THE INVENTION

Throughout this disclosure, various technical and patent publications are referenced to more fully describe the state of the art to which this invention pertains. These publications are incorporated by reference, in their entirety, into this application.

Methods have been developed as lower-cost alternatives to photolithography, the 'gold standard' for microfabrication and microfluidic device creation. Duffy et al. first introduced 'rapid prototyping of masters' whereby they used printed transparencies to replace the expensive chrome masks traditionally utilized in photolithography (Duffy D., et al. (1998) *Anal Chem.* 70: 4974-4984). The authors demonstrated the advantages of using rapid prototyping for masks over conventional photolithography and micromachining. Despite its convenience, the method still requires the use of expensive photoresist, high-resolution printing, and contact lithography. Tan et al. obviated this issue by direct printing; they photocopied designs onto transparencies to fabricate microfluidic channel molds that ranged in height from 8-14 micrometer, depending on the darkness setting of the photocopy machine (Tan A., et al. (2001) *Lab Chip* 1: 7-9). Liu et al. developed a one-step direct-printing technique for the design and fabrication of passive micro-mixers in microfluidic devices, with a maximum channel height of 11 micrometer (Liu A., et al. (2005) *Lab Chip* 5: 974-978). Such shallow channels are adequate for many microfluidic applications but not amenable for use with large mammalian cells (>10 micrometer in diameter) as well as other applications, such as flowing chemotactic gradients across adherent cells in a channel with minimal shearing (Lin F., et al. (2004) *Biochem. And Biophys. Res. Commun.* 319: 576-581).

While Lago et al. introduced a way to circumvent the height limitation of single-layer ink by printing up to four times using a thermal toner transfer method onto a glass substrate, the maximum height obtained with this approach was 25 micrometer (Lago C. L., et al. (2004) *Electrophoresis* 25: 3825-3831). Vullev et al. demonstrated a non-lithographic fabrication approach of microfluidic devices by printing positive-relief masters with a laser-jet printer for detecting bacterial spores; the height of the channels, which is likewise dependent on the height of the ink, is limited to between 5-9 micrometer (Vullev V., et al. (2006) *J. Am. Chem. Soc.* 128: 16062-16072). To achieve deep channels, McDonald et al. introduced the use of solid object printing (SOP) to make PDMS molds in thermoplastics (McDonald J. C., et al. (2002) *Anal. Chem.* 74: 1537-1545). However, despite their versatility, solid object printers are considerably costly ($50,000).

Furthermore, the majority of these methods (as well as conventional photolithography) produce rectangular cross section channels. Pneumatic valves, first introduced by Quake et al., important for many microfluidic applications, require microfluidic channels to be rounded such that they can be completely sealed upon valve closure (Unger M. A., et al. (2000) *Science* 288(5463): 113-116). Achieving rounded micro fluidic channels using typical photolithographic techniques, however, is complicated and requires an extra re-flow step of the photoresist at high temperatures. Most recently, Chao et al. demonstrated an elegant rapid prototyping approach, coined microscale plasma templating (µPLAT), using water molds. This technique enables the creation of rounded channels that are difficult to make with photolithography, but still requires micromachined masks and plasma activation (Chao S. H., et al. (2007) *Lab Chip Technical Note* 7: 641-643).

SUMMARY OF THE INVENTION

A method is provided to prepare a one or more or a plurality microfluidic channels on a receptive material, comprising the steps of a) applying an image-forming material to a heat sensitive thermoplastic receptive material, also referred to as thermoplastic material, in a designed pattern, b) heating said material under conditions that reduce the size of the thermoplastic receptive material, also referred to as thermoplastic material, material by at least about 60%, and c) preparing the microfluidic channels via lithography. In an alternative aspect, the microfluidic channels are created by lithography on the image-formed, heat-reduced thermoplastic material.

Also provided herein is a method to prepare one or more or a plurality of microfluidic channels on a receptive material by etching a designed pattern into a heat sensitive thermoplastic material support and then heating the material under conditions that reduce the size of the thermoplastic receptive material, also referred to as thermoplastic material, material by at least about 60%.

The receptive materials prepared by this method are further provided for the fabrication of various devices to be used in applications such as biological and chemical processing and analysis, micro-mixers, which are necessary for biochemical reactions, chemical synthesis, and biological processes such as biochemical detection involving hybridization analyses, immunoassays, and cell-molecule interactions, near-field optical microscopy, sub-wavelength photonics, biochemical sensing, molecular detection, optical devices, filters and sorters, high-surface area conductors and actuators and solar energy harvesting. Methods of using such devices are also provided herein.

DETAILED DESCRIPTION OF THE INVENTION

Figure 1:
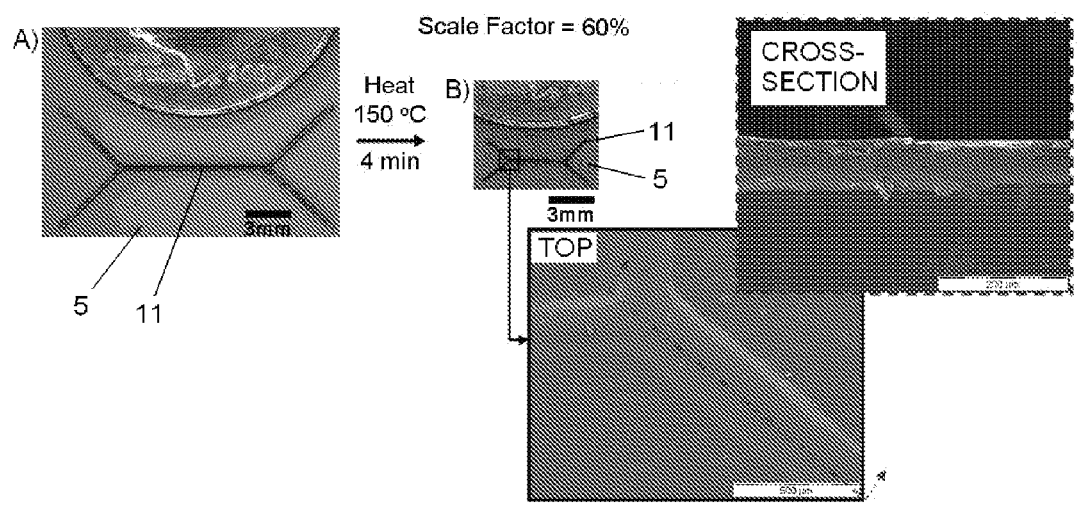
FIG. 1, panels A and B, show thermoplastic (Shrinky-Dink) mold generation having a single microfluidic channel. A) Unshrunken thermoplastic (Shrinky-Dink) master with laser printed master pattern. B) The same master after being baked. Masters shrink from about 800 micrometers to about 300 micrometers in width. The original height of the ink (as measured on transparencies instead of unshrunk thermoplastic because the thermoplastic heats up and shrinks when prepped for the SEM) was approximately 10 micrometers but was difficult to measure precisely on the SEM (see FIG. 3B). Insets: SEM of channel top view and cross-section through a shrunken channel, illustrating a height of 80 micrometers. Heights varied depending on the printer used. For this 80 micrometer channel, the thermoplastic was double printed with transparency mode on the Hewlett-Packard LaserJet 2200D.
Figure 2:
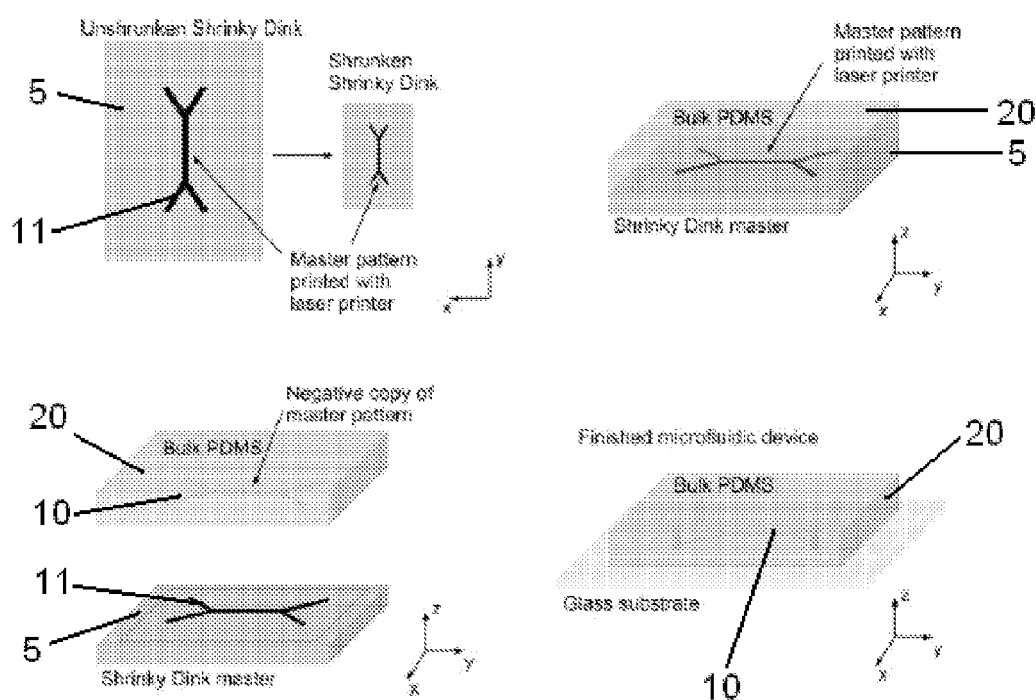
FIG. 2, panels A to D, show process flow. A) The master pattern is produced using CAD software and printed directly onto the Shrinky Dink. After baking, the pattern shrinks by 62.5%. B) PDMS is poured over the master. C) After curing, the PDMS is peeled off, containing a negative copy of the master pattern. D) The molded PDMS is bonded to a glass slide to form microchannels and the finished microdevice.

As used herein, certain terms may have the following defined meanings

As used in the specification and claims, the singular form "a," "an" and "the" include plural references unless the context clearly dictates otherwise. For example, the term "a microfluidic channel" includes a plurality of microfluidic channels.

As used herein, the term "comprising" is intended to mean that the compositions and methods include the recited elements, but do not exclude others. "Consisting essentially of" when used to define compositions and methods, shall mean excluding other elements of any essential significance to the combination when used for the intended purpose. Thus, a composition consisting essentially of the elements as defined herein would not exclude trace contaminants or inert carriers. "Consisting of" shall mean excluding more than trace elements of other ingredients and substantial method steps for preparing the microfluidic device. Embodiments defined by each of these transition terms are within the scope of this invention.

A "thermoplastic material" is intended to mean a plastic material which shrinks upon heating. In one aspect, the thermoplastic materials are those which shrink uniformly without distortion. A "Shrinky-Dink" is a commercial thermoplastic which is used a childrens toy. The shrinking can be either bi-axially (isotropic) or uni-axial (anisotropic). Suitable thermoplastic materials for inclusion in the methods of this invention include, for example, high molecular weight polymers such as acrylonitrile butadiene styrene (ABS), acrylic, celluloid, cellulose acetate, ethylene-vinyl acetate (EVA), ethylene vinyl alcohol (EVAL), fluoroplastics (PTFEs, including FEP, PFA, CTFE, ECTFE, ETFE), ionomers kydex, a trademarked acrylic/PVC alloy, liquid crystal polymer (LCP), polyacetal (POM or Acetal), polyacrylates (Acrylic), polyacrylonitrile (PAN or Acrylonitrile), polyamide (PA or Nylon), polyamide-imide (PAI), polyaryletherketone (PAEK or Ketone), polybutadiene (PBD), polybutylene (PB), polybutylene terephthalate (PBT), polyethylene terephthalate (PET), Polycyclohexylene Dimethylene Terephthalate (PCT), polycarbonate (PC), polyhydroxyalkanoates (PHAs), polyketone (PK), polyester polyethylene (PE), polyetheretherketone (PEEK), polyetherimide (PEI), polyethersulfone (PES), polysulfone polyethylenechlorinates (PEC), polyimide (PI), polylactic acid (PLA), polymethylpentene (PMP), polyphenylene oxide (PPO), polyphenylene sulfide (PPS), polyphthalamide (PPA), polypropylene (PP), polystyrene (PS), polysulfone (PSU), polyvinyl chloride (PVC), polyvinylidene chloride (PVDC) and spectralon. A "Shrinky-Dink" is a commercial thermoplastic material which is marketed as a children's toy. As used herein, the terms "thermoplastic base" and "thermoplastic cover" refer to thermoplastic material having been subjected to both the etching process as well as heating process. The "thermoplastic base" would be located at the bottom or within the device, and the "thermoplastic cover" is the last layer of one or more layers of thermoplastic base.

A "channel" is intended to mean a flow path which is disposed within one or more levels of the microfluidic network structure. The term "microfluidic" is generally defined as a substrate or material having a passage through which a fluid, solid or gas can pass with at least one internal cross-sectional dimension that is less than about 500 micrometers and typically between about 0.1 micrometers and about 500 micrometers which can be used in any number of chemical processes involving very small amounts of material fluid. Such processes include, but are not limited to, electrophoresis (e.g., capillary electrophoresis or CE), chromatography (e.g., liquid chromatography), screening and diagnostics (using, e.g., hybridization or other binding means), and chemical and biochemical synthesis (e.g., DNA amplification as may be conducted using the polymerase chain reaction, or "PCR") and analysis (e.g., through enzymatic digestion).

In addition to the above uses, the microfluidic channels disclosed herein can be patterned for "microfluidic mixing." As used herein, the term "microfluidic mixing" is intended to mean the use of a receptive material having at least two inlet channels, wherein the inlet channels meet or intersect at an overlap region that may be in fluid communication with an outlet channel, such that fluids, such as solutions or other material, introduced from the inlet channels are mixed and may proceed into an outlet channel.

A "solution" is intended to refer to a substantially homogeneous mixture of a solute, such as a solid, liquid, or gaseous substance, with a solvent, which is typically a liquid. The solution can be either aqueous or non-aqueous. Examples of suitable solutes in solutions include fluorescent dyes, biological compounds, such as proteins, DNA and plasma, and soluble chemical compounds. Examples of suitable solids include beads, such as polystyrene beads, and powders, such as a metal powder. A "suspension" is intended to refer to a substantially heterogeneous fluid containing a solid, wherein the solid is dispersed throughout the liquid, but does not substantially dissolve. The solid particles in a suspension will typically settle as the particle size is large, compared to a colloid, where the particle size is small such that the suspension does not settle. Examples of suitable suspensions include biological suspensions such as whole blood, cell compositions, or other cell containing mixtures. It is contemplated that any solution, solid or suspension can be mixed using the mixers disclosed herein, provided that the solid has a particle size sufficiently small to move throughout the channels in the mixer.

In general, the image-forming material is one which is compressed upon heating, bonds to the plastic and is durable (can be used as a mold for multiple iterations). For example, "image-forming material" is, in one aspect, intended to mean a composition, typically a liquid, containing various pigments and/or dyes used for coloring a surface to produce an image or text such as ink and printer toner. In addition to an ink, the image forming material can be a metal, such as gold, titanium, silver, a protein, a colloid, a dielectric substance, a paste or any other suitable metal or combination thereof. Examples of suitable proteins include biotin, fibronectin and collagen. Examples of suitable colloids include pigmented ink, paints and other systems involving small particles of one substance suspended in another. Examples of suitable dielectric substances include metal oxides, such as aluminum oxide, titanium dioxide and silicon dioxide. Examples of suitable pastes include conductive pastes such as silver pastes.

The image forming material can be applied to the thermoplastic material by a variety of methods known to one skilled in the art, such as printing, sputtering and evaporating. The term "evaporating" is intended to mean thermal evaporation, which is a physical vapor deposition method to deposit a thin film of metal on the surface of a substrate. By heating a metal in a vacuum chamber to a hot enough temperature, the vapor pressure of the metal becomes significant and the metal evaporated. It recondenses on the target substrate. As used herein, the term "sputtering" is intended to mean a physical vapor deposition method where atoms in the target material are ejected into the gas phase by high-energy ions and then land on the substrate to create the thin film of metal. Such methods are well known in the art (Bowden et al. (1998) *Nature* (*London*) 393: 146-149; Bowden et al. (1999) *Appl. Phys. Lett.* 75: 2557-2559; Yoo et al. (2002) *Adv. Mater.* 14: 1383-1387; Huck et al. (2000) *Langmuir* 16: 3497-3501; Watanabe et al. (2004) *J. Polym. Sci. Part B: Polym. Phys.* 42: 2460-2466; Volynskii et al. (2000) *J. Mater. Sci.* 35: 547-554; Stafford et al. (2004) *Nature Mater.* 3: 545-550; Watanabe et al. (2005) *J. Polym. Sci. Part B: Polym. Phys.* 43: 1532-1537; Lacour, et al. (2003) *Appl. Phys. Lett.* 82: 2404-2406.)

In addition, the image forming material can be applied to the thermoplastic material using "pattern transfer". The term "pattern transfer" refers to the process of contacting an image-forming device, such as a mold or stamp, containing the desired pattern with an image-forming material to the thermoplastic material. After releasing the mold, the pattern is transferred to the thermoplastic material. In general, high aspect ratio pattern and sub-nanometer patterns have been demonstrated. Such methods are well known in the art (Sakurai, et al., U.S. Pat. No. 7,412,926; Peterman, et al., U.S. Pat. No. 7,382,449; Nakamura, et al., U.S. Pat. No. 7,362,524; Tamada, U.S. Pat. No. 6,869,735).

Another method for applying the image forming material includes, for example "micro-contact printing". The term "micro-contact printing" refers to the use of the relief patterns on a PDMS stamp to form patterns of self-assembled monolayers (SAMs) of an image-forming material on the surface of a thermoplastic material through conformal contact. Micro-contact printing differs from other printing methods, like inkjet printing or 3D printing, in the use of self-assembly (especially, the use of SAMs) to form micro patterns and microstructures of various image-forming materials. Such methods are well known in the art (Cracauer, et al., U.S. Pat. No. 6,981,445; Fujihira, et al., U.S. Pat. No. 6,868,786; Hall, et al., U.S. Pat. No. 6,792,856; Maracas, et al., U.S. Pat. No. 5,937,758).

"Soft-lithography" is intended to refer to a technique commonly known in the art. Soft-lithography uses a patterning device, such as a stamp, a mold or mask, having a transfer surface comprising a well defined pattern in conjunction with a receptive or conformable material to receive the transferred pattern. Microsized and nanosized structures are formed by material processing involving conformal contact on a molecular scale between the substrate and the transfer surface of the patterning device.

The term "receptive material" is intended to refer to a material which is capable of receiving a transferred pattern. In certain embodiments, the receptive material is a conformable material such as those typically used in soft lithography comprise of elastomeric materials, such as polydimethylsiloxane (PDMS). The thermoplastic receptive material, or thermoplastic material, is also a receptive material as it can be etched, for example.

"Imprint lithography" is intended to refer to a technique commonly known in the art. "Imprint lithography" typically refers to a three-dimensional patterning method which utilizes a patterning device, such as a stamp, a mold or mask.

A "mold" is intended to mean an imprint lithographic mold.

A "patterning device" is intended to be broadly interpreted as referring to a device that can be used to convey a patterned cross-section, corresponding to a pattern that is to be created in a target portion of the substrate.

A "pattern" is intended to mean a mark or design.

"Bonded" is intended to mean a fabrication process that joins materials, usually metals or thermoplastics, by causing coalescence. This is often done by melting the materials to form a pool of molten material that cools to become a strong joint, with pressure sometimes used in conjunction with heat, or by itself, to produce the bond.

All numerical designations, e.g., pH, temperature, time, concentration, and molecular weight, including ranges, are approximations which are varied (+) or (−) by increments of 0.1. It is to be understood, although not always explicitly stated that all numerical designations are preceded by the term "about". It also is to be understood, although not always explicitly stated, that the reagents described herein are merely exemplary and that equivalents of such are known in the art.

Methods for Preparing Microfluidic Channels and Supports Containing Same

The methods disclosed herein are capable of fabricating various devices to be used in applications such as biological and chemical processing and analysis, micro-mixers, which are necessary for biochemical reactions, chemical synthesis, and biological processes such as biochemical detection involving hybridization analyses, immunoassays, and cell-molecule interactions, near-field optical microscopy, sub-wavelength photonics, biochemical sensing, molecular detection, optical devices, filters and sorters, high-surface area conductors and actuators and solar energy harvesting.

In one aspect, the present invention is directed to a method to prepare one or more microfluidic channels 10 on a receptive material 20, comprising the steps of, a) applying an image-forming material 11 to a heat sensitive thermoplastic receptive material 5, also referred to as thermoplastic material, in a designed pattern, b) heating said material under conditions that reduce the size of the thermoplastic material 5, material by at least about 60%, and c) preparing the microfluidic channels 10 via lithography.

Figure 4:
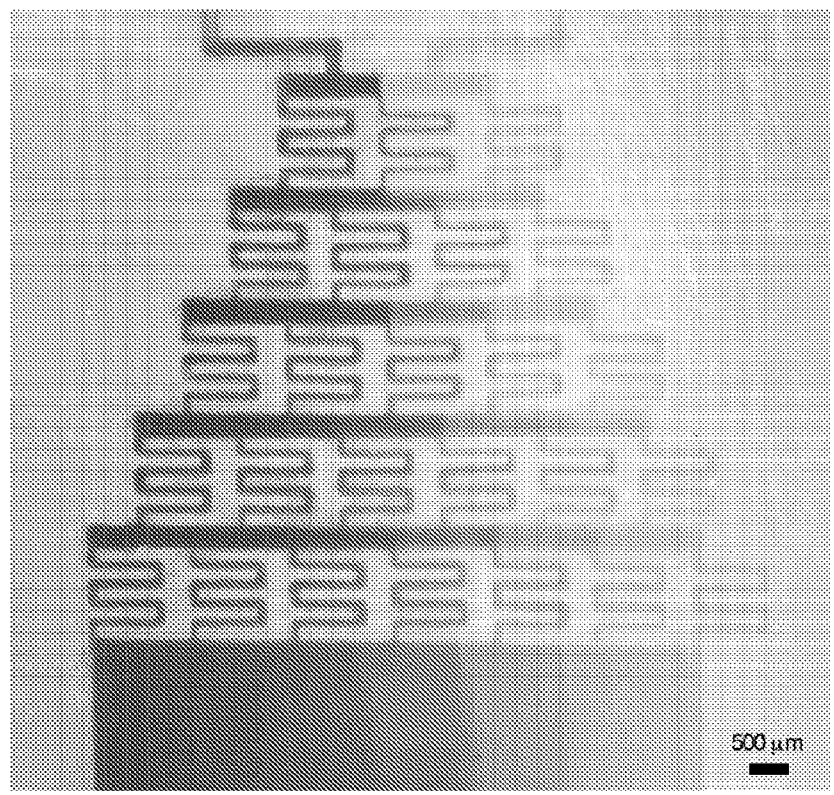
FIG. 4, panels A and B, show functional devices. A) Bonded PDMS gradient generator with food dye. B) Bright field image of Chinese Hamster Ovary (CHO) cells flowing through a single microfluidic channel.
Figure 4:
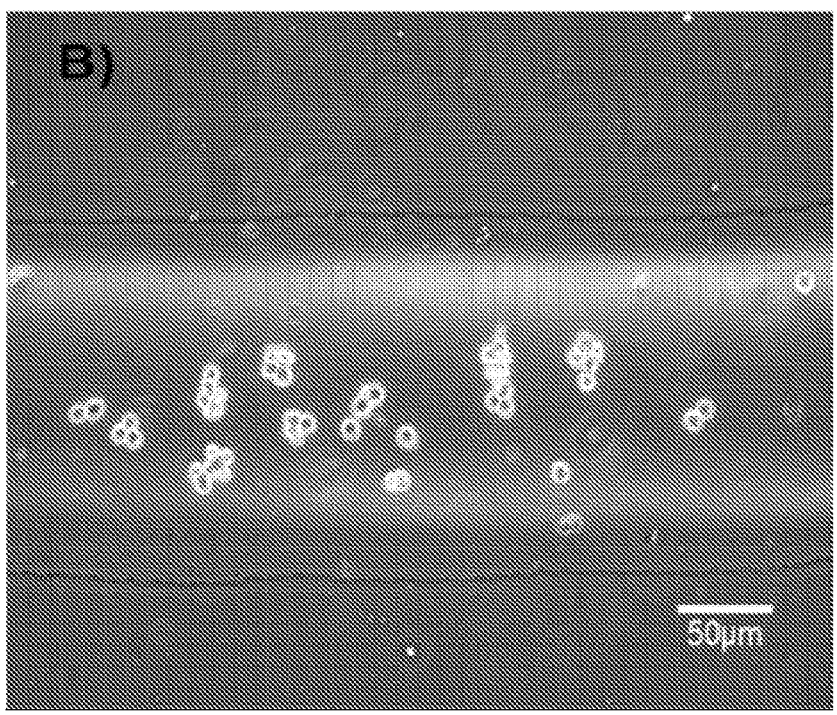

In some embodiments, one microfluidic channels 10 is prepared such as is shown in FIGS. 1 and 4B. In another embodiment, one or more microfluidic channel 10 is formed, such as in the micro-mixer shown in FIG. 12C.

In another aspect, the present invention discloses a method to prepare one or more microfluidic channels 10 on a receptive material 20, comprising the steps of, a) applying an image-forming material 11 to a heat sensitive thermoplastic receptive material 5 in a designed pattern, b) heating said material under conditions that reduce the size of the thermoplastic receptive material 5 by at least about 60%, and c) preparing the microfluidic channels 10 via lithography, wherein the image-forming material 11 is an ink. In the disclosed invention, the ink can be any suitable liquid which contains various pigments and/or dyes used for coloring a surface to produce an image or text such as printer toner.

Figure 16:
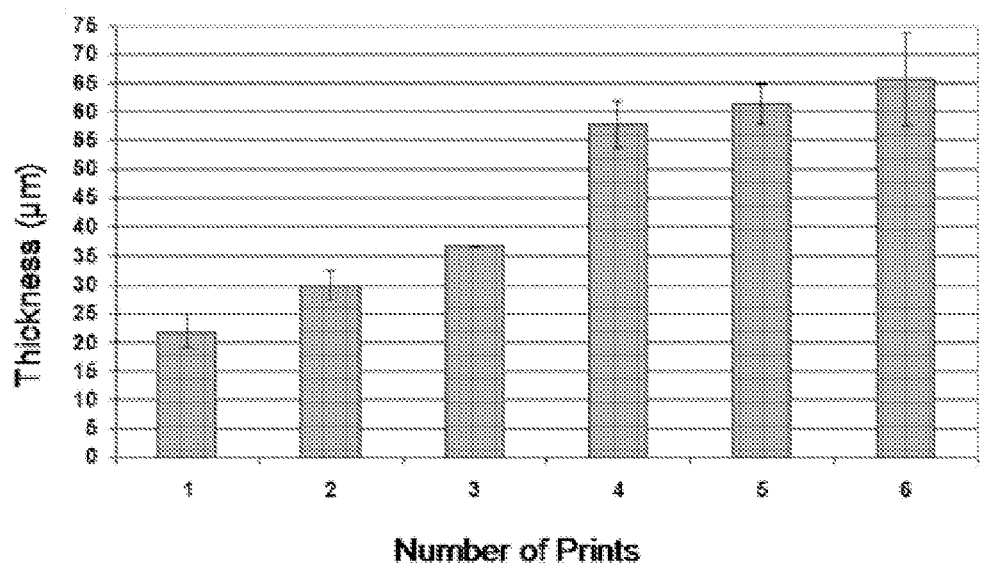
FIG. 16 shows a graph correlating the number of prints of the image-forming material on the thermoplastic material versus the thickness of the channels produced.

The thickness of the image-forming material 11, such as ink or toner, onto the heat sensitive thermoplastic receptive material 5 dictates the depth of the microfluidic channels 10 on the receptive material 20. This correlation is shown graphically in FIG. 16. Therefore, using the methods described herein, one can predictably and reproducibly fabricate microfluidic channels 10 having a known depth.

In certain embodiments, the image-forming material 11 is applied to the heat sensitive thermoplastic receptive material 5 by one or more method comprising sputter coating, evaporation, chemical vapor deposition, pattern transfer, micro-contact printing or printing. In some embodiments, it is applied by printing. The printing can be done using any suitable printer, such as a laser or ink jet printer or computer-controlled plotter, directly onto the thermoplastic material.

Figure 6:
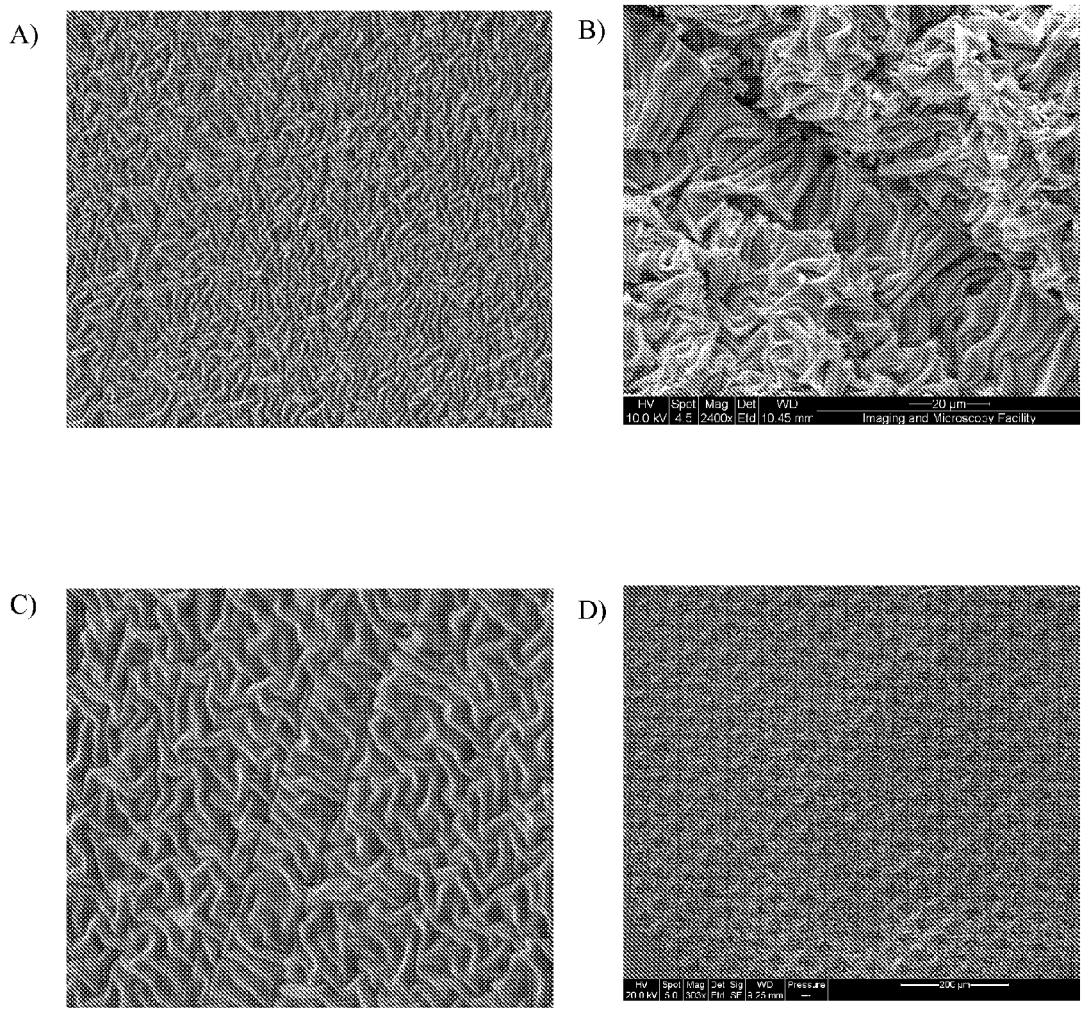
FIG. 6, panels A thru D, show images of the metal deposited on the thermoplastic material.

In an alternative embodiment, the image forming material is a metal. Various metals can be used as an image forming material in the methods of the disclosed invention such as gold, titanium, silver, or any other suitable metal or combination thereof. Images of the metal deposited on the substrate, or thermoplastic material, are shown in FIG. 6. In certain embodiments, the metal is deposited by sputter coating, evaporation or chemical vapor deposition.

In another aspect, the present invention discloses a method to prepare one or more microfluidic channels 10 on a receptive material 20, comprising the steps of, a) applying an image-forming material 11 to a heat sensitive thermoplastic receptive material 5 in a designed pattern, b) heating said material under conditions that reduce the size of the thermoplastic receptive material 5 by at least about 60%, and c) preparing the microfluidic channels 10 via lithography, wherein the image-forming material 11 is applied to the heat sensitive thermoplastic receptive material 5.

The methods disclosed herein are capable of fabricating various devices to be used in applications such as biological and chemical processing and analysis, micro-mixers, which are necessary for biochemical reactions, chemical synthesis, and biological processes such as biochemical detection involving hybridization analyses, immunoassays, and cell-molecule interactions.

In one aspect, the present invention discloses a method to prepare a textured metal surface 13, comprising the steps of a) depositing a metal onto a heat sensitive thermoplastic receptive material 5, and b) reducing the material by at least about 60%, thereby preparing a textured metal surface 13.

In certain embodiments, the application of the image-forming material 11 to the heat sensitive thermoplastic receptive material 5 is by evaporating, which is a physical vapor deposition method to deposit a thin film of metal on the surface of a substrate. By heating a metal in a vacuum chamber to a hot enough temperature, the vapor pressure of the metal becomes significant and the metal evaporated. It recondenses on the target substrate. The height of the metal is dependent on length of processing time. The thermoplastic substrate must be far enough from the source such that the plastic does not heat up during deposition.

After the metal is deposited on the thermoplastic, it is placed in an oven, or similar device, to be heated, and upon heating, because of the stiffness incompatibility between the metal and the shrinking thermoplastic, wrinkles form (FIGS. 6A-6D, 8 and 9). The spacing between the metal wrinkles can be controlled by the amount of heating, and hence shrinkage.

Figure 17:
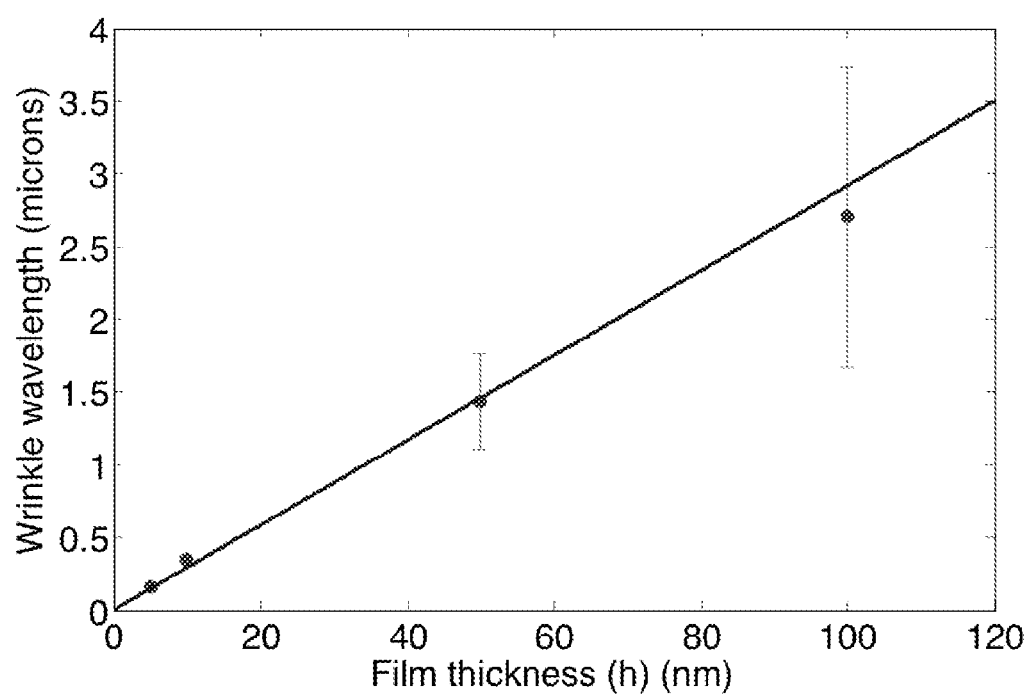
FIG. 17 shows a plot of the maximum average wrinkle wavelength as a function of metal layer thickness. Wrinkle wavelength control by changing the metal film thickness.

Wrinkle height can be controlled by adjusting the metal film thickness. FIG. 17 shows a plot of the maximum average wrinkle height as a function of metal layer thickness. Therefore, one can easily predict the spacing between and height of the metal wrinkles by adjusting the thickness of metal deposited onto the thermoplastic material and the time the thermoplastic material is heated. The thickness of metal deposited onto the thermoplastic material can be easily controlled using the metal deposition methods disclosed herein by adjusting parameters such as time, temperature, and the like. Such methods are well known to one of skill in the art.

Various heights can be achieved from about 2 nanometers to about 100 nanometers. In an particular embodiment, the height of the metal is about 2 nanometers. In an alternative embodiment, the height of the metal is about 5 nanometers, or alternatively, about 10 nanometers, or alternatively, about 20 nanometers, or alternatively, about 30 nanometers, or alternatively, about 40 nanometers, or alternatively, about 50 nanometers, or alternatively, about 60 nanometers, or alternatively, about 70 nanometers, or alternatively, about 80 nanometers, or alternatively, about 90 nanometers, or alternatively, about 100 nanometers.

Varying the height, or thickness, of the metal deposited on the thermoplastic material adjusts the height of the metal wrinkle formed upon shrinking FIG. 17 shows a plot of the maximum average wrinkle height as a function of metal layer thickness. Therefore, one can easily predict the spacing between and height of the metal wrinkles by adjusting the thickness of metal deposited onto the thermoplastic material and the time the thermoplastic material is heated. The thickness of metal deposited onto the thermoplastic material can be easily controlled using the metal deposition methods disclosed herein by adjusting parameters such as time, temperature, and the like. Such methods are well known to one of skill in the art.

In some embodiments, wrinkle heights can be achieved from about 100 nanometers to about 5 micrometers. In an particular embodiment, the height of the metal is about 200 nanometers. In an alternative embodiment, the height of the metal is about 200 nanometers, or alternatively, about 300 nanometers, or alternatively, about 500 nanometers, or alternatively, about 700 nanometers, or alternatively, about 1 micrometer, or alternatively, about 2 micrometers, or alternatively, about 3 micrometers, or alternatively, about 4 micrometers, or alternatively, less than about 5 micrometers.

Figure 7:
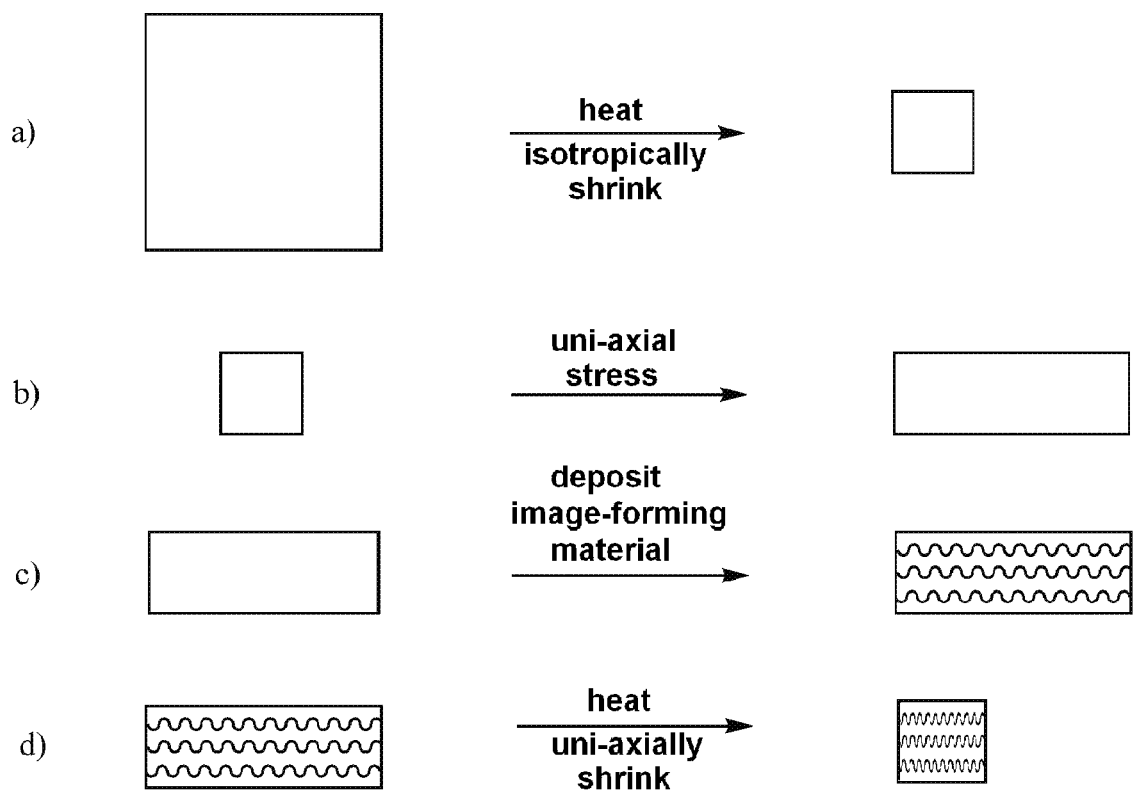
FIG. 7, panels A thru D, is a schematic of the process for monodirectional shrinkage of the thermoplastic material.
Figure 8:
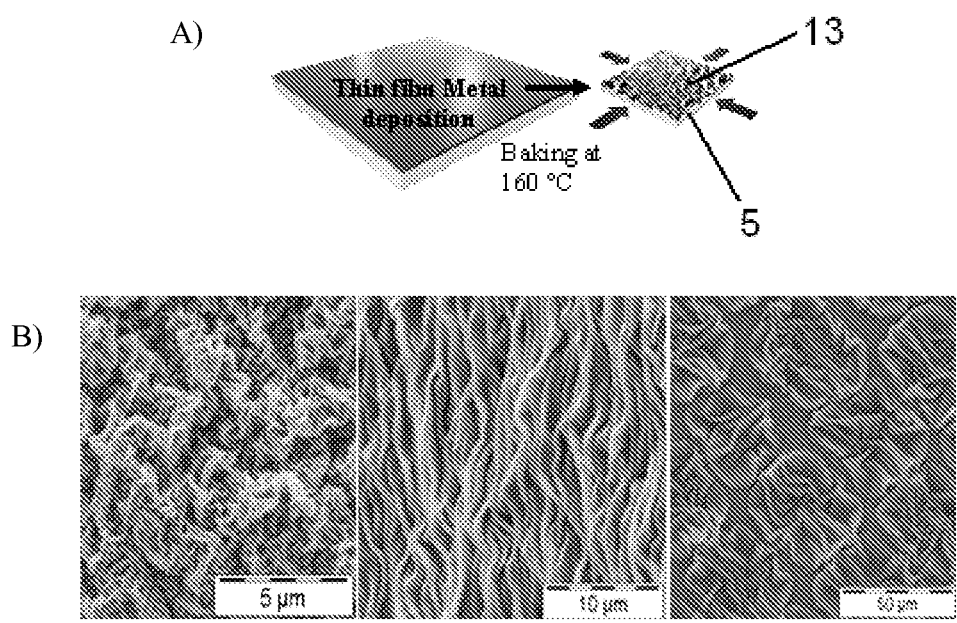
FIG. 8A is a schematic of nano-wrinkles fabrication.
FIG. 8B shows SEM images of bi-axial (left), uni-axial (middle) and micropatterned (right) wrinkles.
Figure 9:
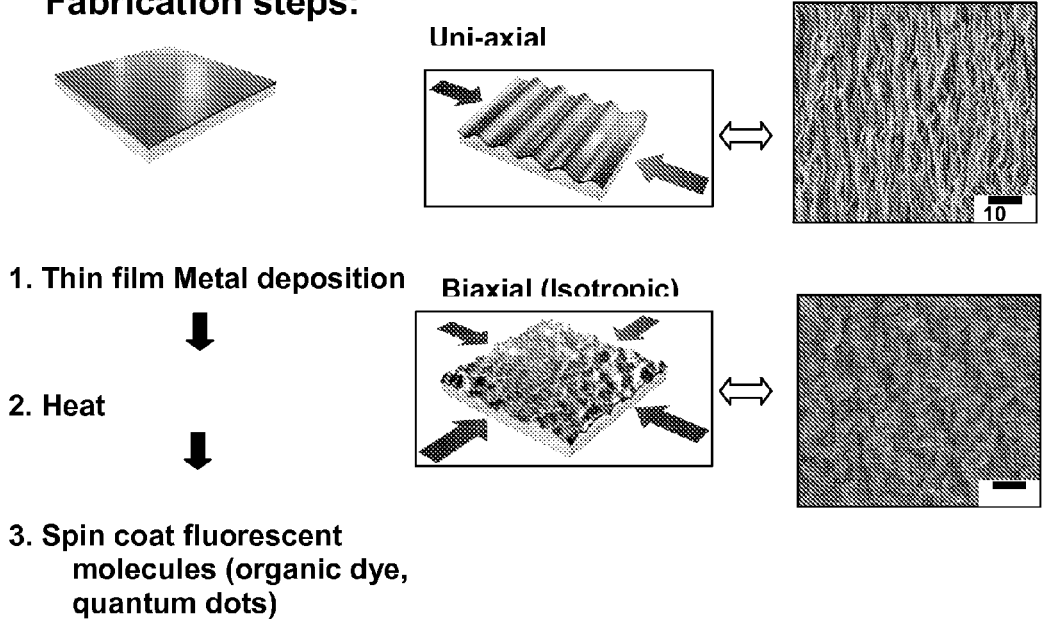
FIG. 9 shows a schematic of nano-wrinkles fabrication and SEM images of uni-axial (anisotropic, top) and bi-axial (isotropic, bottom) wrinkles

In addition, the directionality of the wrinkles is controlled by grooving the substrate prior to metal deposition. Alternatively, the directionality of the wrinkles can be controlled by monodirectional shrinking using a uni-axially biasing thermoplastic receptive material 5 (FIGS. 7, 8 and 9). In one embodiment, the method to prepare a textured metal surface 13 further comprises first heating a heat sensitive thermoplastic receptive material 5 under conditions that reduce the size of the thermoplastic receptive material 5 bi-axially by at least about 60%, followed by uni-axially biasing the thermoplastic receptive material 5 to shrink along one axis or dimension prior to depositing a metal onto a heat sensitive thermoplastic receptive material 5, and reducing the material 5 by at least about 60%, thereby preparing a textured metal surface 13. This method is illustrated in FIGS. 7, 8 and 9.

In one aspect, the size of the textured metal surface 13 is substantially the same as the thermoplastic receptive material 5 before the receptive material was uni-axially biased. In one embodiment, the thermoplastic receptive material 5 is uni-axially biased using heat.

It is contemplated that any metal can be deposited onto the thermoplastic receptive material 5 to fabricate the metal wrinkles disclosed herein. In some embodiments, the metal is at least one of silver, gold or copper. Depending on the intended use of the metal surface, it may be desired that the metal be deposited in a given pattern or design. For example, as shown in FIG. 8, the metal can be deposited to only a desired area of the thermoplastic receptive material 5 to form isolated metal sections or 'islands' on the thermoplastic receptive material 5. Methods for the controlled deposition of metals are well known in the art.

The periodicity of the wrinkle as the wavelength of the wrinkles scale according to the thickness to the ¾th power. Therefore, tighter wrinkles are achieved by changing the thickness, or height of the metal layer.

Alternatively, the application of the image-forming material 11 to the heat sensitive thermoplastic receptive material 5 is accomplished by sputtering. Sputtering is a physical vapor deposition method where atoms in the target material are ejected into the gas phase by high-energy ions and then land on the substrate to create the thin film of metal.

The methods disclosed herein are capable of fabricating various devices to be used in applications such as near-field optical microscopy, sub-wavelength photonics, biochemical sensing, molecular detection, optical devices, filters and sorters, high-surface area conductors and actuators and solar energy harvesting.

In another aspect, the present invention discloses a method to prepare one or more microfluidic channels 10 on a receptive material 20, comprising the steps of, a) applying an image-forming material 11 to a heat sensitive thermoplastic receptive material 5 in a designed pattern, b) heating said material under conditions that reduce the size of the thermoplastic receptive material 5 by at least about 60%, and c) preparing the microfluidic channels 10 via lithography, wherein the image-forming material 11 is heated under conditions to achieve a height greater than about 25 micrometers. In an alternative embodiment, the image-forming material 11 is heated under conditions to achieve a height greater than about 15 micrometers, or alternatively a height greater than about 30 micrometers, or alternatively a height greater than about 40 micrometers, or alternatively a height greater than about 50 micrometers, or alternatively a height greater than about 60 micrometers, or alternatively a height greater than about 70 micrometers, or alternatively a height greater than about 80 micrometers, or alternatively a height greater than about 80 micrometers, or alternatively a height greater than about 90 micrometers.

In another aspect, the present invention discloses a method to prepare one or more microfluidic channels 10 on a receptive material 20, comprising the steps of, a) applying an image-forming material 11 to a heat sensitive thermoplastic receptive material 5 in a designed pattern, b) heating said material under conditions that reduce the size of the thermoplastic receptive material 5 by at least about 60%, and c) preparing the microfluidic channels 10 via lithography, further comprising repeating step a) two or more times prior to performing step b).

In another aspect, the present invention discloses a method to prepare one or more microfluidic channels 10 on a receptive material 20, comprising the steps of, a) applying an image-forming material 11 to a heat sensitive thermoplastic receptive material 5 in a designed pattern, b) heating said thermoplastic receptive material 5 under conditions that reduce the size of the thermoplastic receptive material 5 by at least about 60%, and c) preparing the microfluidic channels 10 via lithography, wherein one or more microfluidic channels 10 of varying heights is produced.

In some embodiments, the height of the microfluidic channels 10 is from about 15 to about 120 micrometers. Alternatively, the height is from about 15 to about 90 micrometers, or alternatively, about 30 to about 90 micrometers, or alternatively, less than about 120 micrometers, or alternatively, less than about 100 micrometers, or alternatively, less than about 90 micrometers, or alternatively, about 75 micrometers, or alternatively, about 60 micrometers, or alternatively, about 50 micrometers, or alternatively, about 40 micrometers, or alternatively, about 30 micrometers, or alternatively, greater than about 15 micrometers.

It is contemplated that any thermoplastic material 5 can be used in the methods disclosed herein. In one aspect of the disclosed invention, the thermoplastic materials 5 are those which shrink uniformly without substantial distortion. Suitable thermoplastic materials 5 for inclusion in the methods of this invention include, for example, high molecular weight polymers such as acrylonitrile butadiene styrene (ABS), acrylic, celluloid, cellulose acetate, ethylene-vinyl acetate (EVA), ethylene vinyl alcohol (EVAL), fluoroplastics (PTFEs, including FEP, PFA, CTFE, ECTFE, ETFE), ionomers kydex, a trademarked acrylic/PVC alloy, liquid crystal polymer (LCP), polyacetal (POM or Acetal), polyacrylates (Acrylic), polyacrylonitrile (PAN or Acrylonitrile), polyamide (PA or Nylon), polyamide-imide (PAI), polyaryletherketone (PAEK or Ketone), polybutadiene (PBD), polybutylene (PB), polybutylene terephthalate (PBT), polyethylene terephthalate (PET), Polycyclohexylene Dimethylene Terephthalate (PCT), polycarbonate (PC), polyhydroxyalkanoates (PHAs), polyketone (PK), polyester polyethylene (PE), polyetheretherketone (PEEK), polyetherimide (PEI), polyethersulfone (PES), polysulfone polyethylenechlorinates (PEC), polyimide (PI), polylactic acid (PLA), polymethylpentene (PMP), polyphenylene oxide (PPO), polyphenylene sulfide (PPS), polyphthalamide (PPA), polypropylene (PP), polystyrene (PS), polysulfone (PSU), polyvinyl chloride (PVC), polyvinylidene chloride (PVDC) and spectralon. In one embodiment, the thermoplastic material 5 is polystyrene.

In another aspect, the present invention discloses a method to prepare one or more microfluidic channels 10 on a receptive material 20, comprising the steps of, a) applying an image-forming material 11 to a heat sensitive thermoplastic receptive material 5 in a designed pattern, b) heating said material under conditions that reduce the size of the thermoplastic receptive material 5 by at least about 60%, and c) preparing the microfluidic channels 10 via lithography, wherein the lithography of step c) refers to soft lithography or imprint lithography. Conformable materials, or receptive materials 20, typically used in soft lithography usually comprise of elastomeric materials, such as polydimethylsiloxane (PDMS) for example.

Yet another aspect of the invention includes a method to prepare one or more microfluidic channels 10 on a receptive material 20, comprising the steps of a) etching a designed pattern into a heat sensitive thermo plastic material 5 and b) heating said material under conditions that reduce the size of the thermoplastic receptive material 5 by at least about 60%, thereby preparing the microfluidic channels 10.

Figure 10:
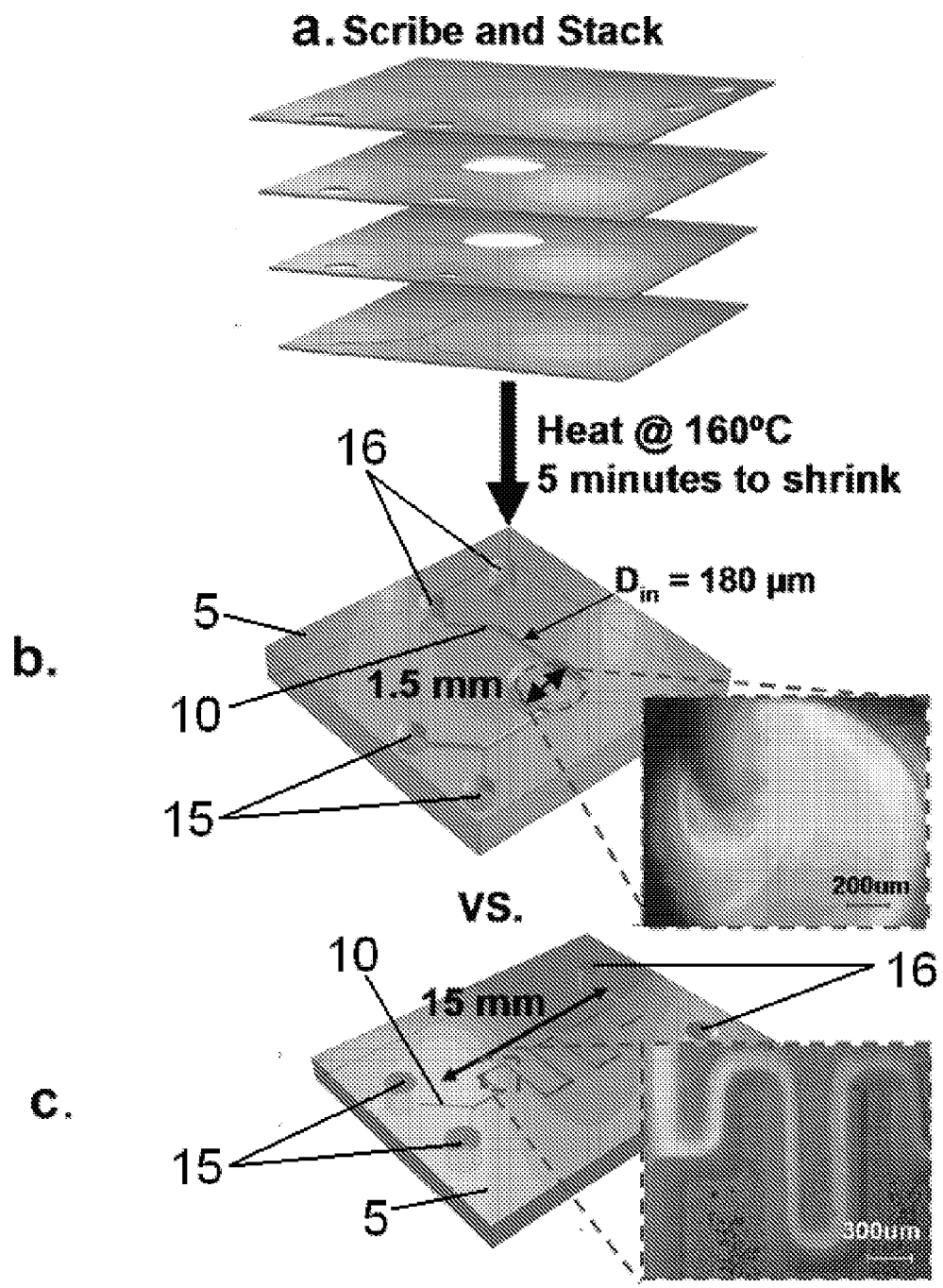
FIG. 10A shows the fabrication of a micro-mixer.
FIG. 10B shows the final vortex micro-mixer versus the 2D serpentine design (FIG. 10C). The insets show the fluorescence overlaid bright field images which illustrate the mixing dynamics of each approach.

A three dimensional mixer, or micro-mixer, can be fabricated by the methods disclosed herein. One embodiment is directed to the method disclosed above, wherein the etched heat sensitive thermoplastic material 5 is bonded onto another non-etched heat sensitive thermoplastic material 5 by stacking said etched heat sensitive thermoplastic material 5 and non-etched heat sensitive thermoplastic material 5 and heating to their glass-transition temperature to produce microfluidic chips. This is aspect of the invention is illustrated in FIG. 10.

The depth of the microfluidic channels 10 can be easily tailored during the fabrication process. For example, in some embodiments, the thermoplastic material 5 is heated under conditions to achieve microfluidic channels 10 from about 50 to about 600 micrometers. In another embodiment, the thermoplastic material 5 is heated under conditions to achieve microfluidic channels 10 of about 50 micrometers, or alternatively, about 100 micrometers, or alternatively, about 150 micrometers, or alternatively, about 200 micrometers, or alternatively, about 300 micrometers, or alternatively, about 400 micrometers, or alternatively, about 500 micrometers, or alternatively, about 600 micrometers.

For mixing, the thermoplastic receptive material 5 should have at least one or more inlet 15 channels, wherein the inlet 15 channels meet or intersect at an overlap region that may be in fluid communication with one or more outlet 16 channels, such that a substance, such as a solution, solid or suspension, introduced from the inlet 15 channels are mixed and may proceed into an outlet 16 channel. Dimensions of the inlet 15 and outlet 16 channels would need to be sufficiently large as to allow the loading of the substances to be mixed. Typically, the diameter of the inlet 15 and outlet 16 channels would be less than 1 millimeter, or alternatively, less than 500 micrometers, or alternatively, less than 100 micrometers, or alternatively, less than 50 micrometers, or alternatively, less than 10 micrometers, or alternatively, less than 1 micrometer, or alternatively, less than 0.500 micrometers. In general, the substances are loaded into the micro-mixer via syringe.

It is contemplated that any solution, solid or suspension can be mixed using the mixers disclosed herein, provided that the solid has a particle size sufficiently small to move throughout the mixer.

In one embodiment, the thermoplastic material 5 is polystyrene.

Alternative embodiments of the methods include, but are not limited to the application of heat to reduce the size of the thermoplastic receptive material 5 by at least 65%, or alternatively, at least 70%, or alternatively, at least 75%, or alternatively, at least 80%, or alternatively, at least 85%, or alternatively, at least 90%.

In one aspect, this invention is directed to a novel approach for the ultra-rapid direct patterning of complex three-dimensionally stacked polystyrene (PS) microfluidic chips as well as the rapid mold making of polydimethylsiloxane (PDMS) chips. By leveraging the inherent shrinkage properties of biaxially oriented thermoplastic sheets, design conception to fully functional chips can be completed within minutes.

Devices

The methods disclosed herein are capable of fabricating various devices to be used in applications such as biological and chemical analysis, micro-mixers, which are necessary for biochemical reactions, chemical synthesis, and biological processes such as biochemical detection involving hybridization analyses, immunoassays, and cell-molecule interactions, near-field optical microscopy, sub-wavelength photonics, biochemical sensing, molecular detection, optical devices, filters and sorters, high-surface area conductors and actuators and solar energy harvesting.

One embodiment of the invention is directed to a receptive material comprising one or more microfluidic channels 10, wherein the depth of one or more channels 10 is from about 15 to about 150 micrometers and the width is from about 1 to about 500 micrometers. In one aspect, the average depth all the channels 10 is from about 15 to about 150 micrometers and the width is from about 1 to about 150.

It is contemplated that the width of the microfluidic channels 10 can vary greatly depending on the desired use of the device. In one embodiment, one or more channels 10 have a width of from about 1 to about 500 micrometers.

In addition, channels 10 having varying depths can be fabricated using the methods disclosed herein. The thickness of the image-forming material 11, such as ink or toner, onto the heat sensitive thermoplastic receptive material 5 dictates the height of the image-forming material 11, and thus the depth of the microfluidic channels 10 on the receptive material 20. This correlation is shown graphically in FIG. 16. Therefore, using the methods described herein, one can predictably and reproducibly fabricate microfluidic channels 10 having a known depth. In an particular embodiment, one or more channels 10 have a depth of from about 25 to about 90 micrometers. In an alternative embodiment, one or more channels 10 have a depth of about 15 micrometers, or alternatively, about 20 micrometers, or alternatively, about 30 micrometers, or alternatively, about 40 micrometers, or alternatively, about 50 micrometers, or alternatively, about 60 micrometers, or alternatively, about 70 micrometers, or alternatively, about 80 micrometers. In one embodiment, one or more channels 10 have a depth of from about 25 to about 60 micrometers.

In one aspect of the invention, the closed end of the channels 10 of the device have an arched curvature. This aspect is unique in that fabricating a microfluidic device having channels 10 with an arched curvature is a challenge using other know methods of microfabrication. The contour of the channels 10 has implications in cell growth, fluid dynamics, as well as in other applications.

In one embodiment, the receptive material 20 is polydimethylsiloxane.

Another embodiment of the invention is directed to a microfluidic device comprising a heat-shrunk thermoplastic base having one or more microfluidic channels 10 etched into a surface of the thermoplastic base, wherein the depth of one or more channels 10 is from about 50 to about 600 micrometers and the width is from about 1 to about 500 micrometers. In one embodiment, the average depth all the channels 10 is from about 50 to about 600 micrometers and the width is from about 1 to about 500 micrometers.

Again, it is contemplated that the width of the microfluidic channels 10 can vary greatly depending on the desired use of the device. In one embodiment, one or more channels 10 have a width of from about 1 to about 500 micrometers.

In addition, microfluidic devices having one or more microfluidic channels 10 etched into a surface of the thermoplastic base can be fabricated with channels 10 of varying depths depending on the degree of etching. In an particular embodiment, one or more channels 10 have a depth of from about 50 to about 600 micrometers. In another embodiment, one or more channels 10 have a depth of from about 100 to about 300 micrometers. In an alternative embodiment, one or more channels 10 have a depth of about 50 micrometers, or alternatively, about 100 micrometers, or alternatively, about 150 micrometers, or alternatively, about 200 micrometers, or alternatively, about 250 micrometers, or alternatively, about 300 micrometers, or alternatively, about 400 micrometers, or alternatively, about 500 micrometers, or alternatively, about 600 micrometers.

Another embodiment of the invention is directed to a micro-mixer comprising a heat-shrunk thermoplastic base having one or more microfluidic channels 10 etched into a surface of the thermoplastic base, wherein the depth of one or more channels 10 is from about 50 to about 600 micrometers and the width is about 1 to about 500 micrometers, in communication with at least one inlet 15 and at least one outlet 16, and a non-etched heat-shrunk thermoplastic cover bonded overtop the thermoplastic base, having at least one inlet 15 and at least one outlet 16 in communication with the microfluidic channel 10.

In a specific embodiment, disclosed herein is a three-dimensional micro-mixer comprising a stack of more than one heat-shrunk etched thermoplastic base having one or more microfluidic channels 10 etched into a surface of the thermoplastic base, wherein the depth of one or more channels 10 is from about 50 to about 600 micrometers and the width is about 1 to about 500 micrometers, in communication with at least one inlet 15 and at least one outlet 16, and a non-etched heat-shrunk thermoplastic cover bonded overtop the thermoplastic base, having at least one inlet 15 and at least one outlet 16 in communication with the microfluidic channel 10.

Figure 5:
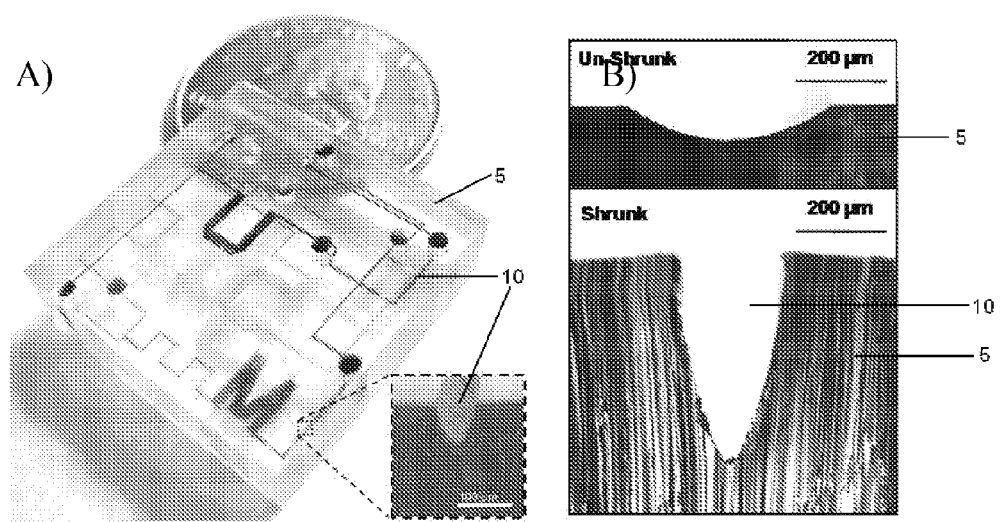
FIG. 5, panels A and B, show a thermoplastic (Shrinky-Dink) microchips. (A) 3D micro-mixers from a thermoplastic (Shrinky-Dink). This is a 3 layer device in which the blue and yellow are on different levels and mix to form green on the 3rd layer. (B) SEMs of various channel shapes and sizes attained by simply scribing and then heating.

Micro-mixers are useful for conducting biochemical reactions, chemical synthesis, and biological processes such as biochemical detection involving hybridization analyses, immunoassays, and cell-molecule interactions. A two-dimensional micro-mixer is shown in FIGS. 4A, 10 and 12B. Various examples of three-dimensional micro-mixers are shown in FIGS. 5 and 12C.

In one embodiment, the average depth all the channels 10 is from about 50 to about 600 micrometers and the width is from about 1 to about 500 micrometers. The width of the microfluidic channels 10 can vary greatly depending on the desired use of the device. In one embodiment, one or more channels 10 have a width of from about 1 to about 500 micrometers.

In addition, micro-mixers having one or more microfluidic channel 10 can be fabricated with channels 10 of varying depths depending on the degree of etching. In an particular embodiment, one or more channels 10 have a depth of from about 50 to about 600 micrometers. In another embodiment, one or more channels 10 have a depth of from about 100 to about 300 micrometers. In an alternative embodiment, one or more channels 10 have a depth of about 50 micrometers, or alternatively, about 100 micrometers, or alternatively, about 150 micrometers, or alternatively, about 200 micrometers, or alternatively, about 250 micrometers, or alternatively, about 300 micrometers, or alternatively, about 400 micrometers, or alternatively, about 500 micrometers, or alternatively, about 600 micrometers.

Another embodiment of the invention is directed to a device comprising a heat-shrunk thermoplastic base having a textured metal surface 13, wherein the texture has an average height from about 100 nanometers to about 5 micrometers. In one embodiment, the texture has an average height of about 100 nanometers, or alternatively, about 100 nanometers, or alternatively, about 300 nanometers, or alternatively, about 500 nanometers, or alternatively, about 700 nanometers, or alternatively, about 1 micrometer, or alternatively, about 2 micrometers, or alternatively, about 3 micrometers, or alternatively, about 4 micrometers, or alternatively, less than about 5 micrometers.

Wrinkle height can be controlled by adjusting the metal film thickness. FIG. 17 shows a plot of the maximum average wrinkle height as a function of metal layer thickness. Therefore, one can easily predict the spacing between and height of the metal wrinkles by adjusting the thickness of metal deposited onto the thermoplastic material 5 and the time the thermoplastic material 5 is heated. The thickness of metal deposited onto the thermoplastic material 5 can be easily controlled using the metal deposition methods disclosed herein by adjusting parameters such as time, temperature, and the like. Such methods are well known to one of skill in the art.

Such devices having a textured metal surface 13 or "metal wrinkles" are useful in molecular detection, optical devices, filters and sorters, high-surface area conductors and actuators, molecular detection, optical devices, filters and sorters, high-surface area conductors and actuators, metrology, surface-enhanced Raman scattering (SERS), metal-enhanced fluorescence (MEF), and extraordinary light transmission. Exploitation of these and other plasmon-induced effects have benefited numerous applications, including near-field optical microscopy, sub-wavelength photonics, biochemical sensing and solar energy harvesting. It is contemplated that the metal can be any metal, such as at least one of silver, gold or copper.

INDUSTRIAL APPLICABILITY

The devices disclosed herein are capable of being utilized in a variety of applications, such as biological and chemical analysis, micro-mixers, which are necessary for biochemical reactions, chemical synthesis, and biological processes such as biochemical detection involving hybridization analyses, immunoassays, and cell-molecule interactions, near-field optical microscopy, sub-wavelength photonics, biochemical sensing, molecular detection, optical devices, filters and sorters, high-surface area conductors and actuators and solar energy harvesting.

Advances in microfluidics technology are revolutionizing molecular biology procedures for enzymatic analysis (e.g., glucose and lactate assays), DNA analysis (e.g., polymerase chain reaction and high-throughput sequencing), and proteomics. The basic idea of microfluidic devices is to integrate assay operations such as detection, as well as sample pre-treatment and sample preparation on one chip.

One embodiment of the invention is directed to a method of analyzing a substance, comprising adding the substance to a receptive material 20 or thermoplastic material 5 comprising one or more microfluidic channels 10, wherein the depth of the channels 10 is from about 15 to about 150 micrometers and the width is from about 1 to about 500 micrometers. In certain embodiments, the substance is a solution, solid or suspension.

In another embodiment, the invention is directed to a method of analyzing a substance comprising adding the substance to a microfluidic device comprising a heat-shrunk thermoplastic base having one or more microfluidic channels 10 etched into a surface of the thermoplastic base, wherein the depth of the channels 10 is from about 50 to about 600 micrometers and the width is from about 1 to about 500 micrometers.

Methods for analyzing chemical and biochemical processes are well known to those of skill in the art of surface sensing. Many commonly used methods for analyzing a substance are optically-based, such as fluorescence spectroscopic methods. Other methods are based on inelastic scattering, such as Raman spectroscopy or on plasmon resonance, such as surface plasmon resonance.

Figure 13:
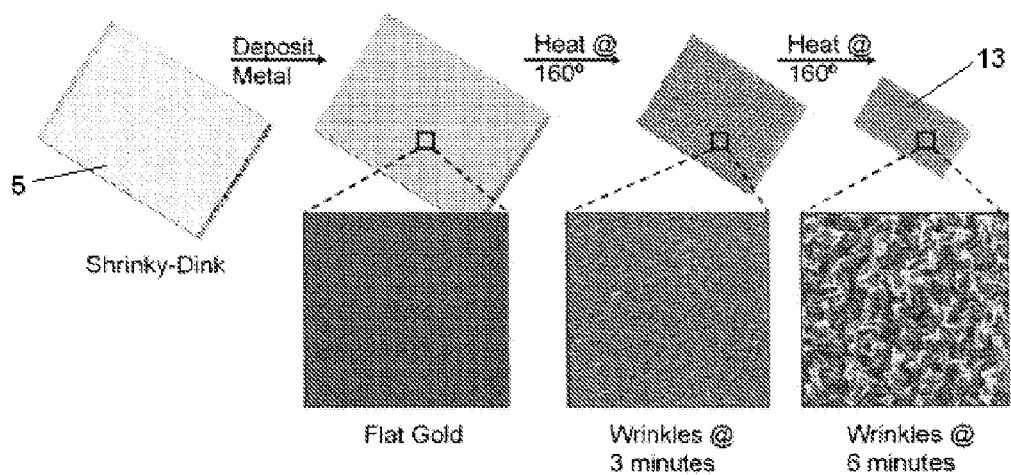
FIG. 13 shows a schematic of the method for forming the metal wrinkles and SEM images during different points in the process.

In one aspect, the present invention discloses a method to prepare a micro-mixer. This methodology easily and rapidly fabricates complex designs, including a functional 2-D gradient generator, optical traps, and even a 3-D micro-mixer (FIGS. 5, 10 and 13). Micro-mixing, though fundamental to most every miniaturized biological and chemical analysis system, still poses a considerable challenge in 2-D due to the inherent laminar flow regime. Whereas this problem can be somewhat alleviated with 3-D designs, to date, developing 3D micro-mixers and 3-D microfluidic devices in general, has been extremely difficult due to issues with alignment and bonding. Analogous to stacked integrated circuits, the ability to simply fabricate complex 3-D microfluidic devices will additionally allow for faster mixing times, increased miniaturization, and increased processing power.

The ability to effectively mix dissimilar fluids is fundamentally important in biological and chemical processing and analysis. Mixing macromolecular solutions at the microscale is necessary for biochemical reactions, chemical synthesis, and biological processes (Stone, H. A., et al. Annu Rev. Fluid. Mech. (2004) 36: 381, Yager, P., et al. (2006) Nature 442: 412, Vijayendran, R. A., et al. (2003) Langmuir 19, 1824). Moreover, rapid mixing is critical, for example, in biochemical detection involving hybridization analyses, immunoassays, and cell-molecule interactions (Burke B. J., et al. (2003) Anal. Chem. 75, 1786, Nguyen N. T., et al. (2005) Micromech. Microeng. 15: R1). Despite its importance to miniaturized 'lab on a chip' analysis systems, micro-mixing is ironically difficult to achieve within such micro-scale systems (Xia, H. M., et al. (2005) Lab Chip 5: 748, Aubin, J., et al. (2003) Chem. Eng. and Technol. 26: 1262, Ottino, J. M., et al. (2004) Science 305: 485, Campbell, C. J., et al. (2004) Phil. Trans. R. Soc. Lond. A 362: 1069). Because molecular diffusion dominates mixing at these small scales with persistent laminar flow (the transition to turbulent flow occurs at Reynolds numbers greater than 2000 in straight microchannels 10, see Campbell, supra), large molecules with low diffusion coefficients in particular require considerable time to mix (Oddy, H., et al. (2001) Anal. Chem. 73: 5822). For effective mixing, interfacial surface areas must therefore be maintained. While this can be achieved by flowing the dissimilar solutions in tangent over considerable lengths, long microfluidic channels 10 (on the order of centimeters) negate the intended benefits of miniaturization (Sudarsan, A. P., et al. (2006) Proc. Nat. Acad. Sci. U.S.A. 103: 7228). More critically, rapid mixing remains a challenge.

To provide rapid and effective mixing in micro-scale systems, active mixers and/or complex passive designs are typically required. "Active mixers" actuate by moving parts or through externally applied forces (e.g. pressure or electric fields). For example, Oddy et al. used oscillating electric fields to create electro-osmotic flow that induces electro-kinetic instability to stir microflow streams (Oddy, supra). Hellman et al. used highly focused nanosecond laser pulses to create cavitation bubbles that expand and then collapse to disrupt the laminar flow of parallel fluid streams in microfluidic channels 10, producing a localized region of mixed fluid (Hellman, A. N., et al. (2007) Anal. Chem. 79, 4484). Nui et al. developed a chaotic micro-mixer based on hydrodynamic pulsating pumps to disturb the liquid (Niu, X, et al. (2006) Appl. Phys. Lett. 88: 153508). Other strategies for active mixing include magnetic stirring and ultrasound (Ryu, K. S., et al. (2004) Lab Chip 4: 608, Liu, R. H., et al. (2002) Lab Chip 2: 151). Rotary micro-mixers require very high rotational speeds and Re numbers on the order of 100's to achieve turbulent mixing (Campbell, supra). Moreover, these active mixers typically require a substantially more complex setup (laser, voltage, or other actuating source) and subject potentially fragile specimens (e.g. cells or cellular components) to considerable external energy.

Passive mixers utilize system geometry to create favorable hydrodynamics and avoid many of the complications associated with active mixers. The 2D 'serpentine' mixer is the classical microfluidic mixer, which sustains two fluid streams tangentially to achieve mixing by molecular diffusion over considerable lengths (Derringer, S. K., et al. (2001) Anal. Chem. 73: 1240). Alternatively, chaotic-mixing strategies leverage transverse flows that expand the interfacial area between solutions by folding and stretching (Stremler, M. A., et al. (2004) Phil. Trans. R. Soc. Lond. A 362: 1019). Sundersen et al. developed an innovative approach that leverages naturally arising transverse (Dean) flow fields using a planar split-and-recombine (P-SAR) and an asymmetric serpentine micro-mixer (ASM) configuration (Oddy, supra). Strook et al. created chaotic mixing by using relief structures on the floor of a microfluidic channel (Stroock, A. D., et al. (2002) Science 295: 647).

While rapid mixing in 2D is considerably more difficult and requires such geometrically ingenious strategies, up to now, 3D mixing has been limited due to the challenges associated with microfabricating such devices, which could require up to days (Oddy, supra). Beebe et al. used eddies generated at the bends of a helical microchannel for chaotic advective mixing (Liu, R. H., et al. (2000) Microelectromech. Syst. 9: 190). Lin et al. developed a complex three-layer glass self-rotational vortex mixer for low Re in which two inlet 15 channels divide into eight individual channels tangent to a 3D circular chamber (Lin, C. H., et al. (2005) Micromech. Microeng. 15: 935).

In a particular embodiment, the invention describes a method for microfluidic mixing comprising adding a solution to any of the receptive materials 20 or thermoplastic material 5 containing one or more microfluidic channels 10 described herein. In one embodiment, the invention describes a method to prepare one or more microfluidic channels 10 on a thermoplastic receptive material 5, comprising the steps of a) etching a designed pattern into a heat sensitive thermoplastic material 5 and b) heating said material 5 under conditions that reduce the size of the thermoplastic receptive material 5 by at least about 60%, thereby preparing the microfluidic channels 10.

A three dimensional mixer, or micro-mixer, can be fabricated by the methods disclosed herein. One embodiment is directed to the method disclosed above, wherein the etched heat sensitive thermoplastic material 5 is bonded onto another non-etched heat sensitive thermoplastic material 5 by stacking said etched heat sensitive thermoplastic material 5 and non-etched heat sensitive thermoplastic material 5 and heating to their glass-transition temperature to produce microfluidic chips. This is aspect of the invention is illustrated in FIG. 10.

In one embodiment, the invention is directed to a method for microfluidic mixing a substance comprising adding the substance to a micro-mixer comprising a heat-shrunk thermoplastic base having one or more microfluidic channels 10 etched into a surface of the thermoplastic base, wherein the depth of one or more channels 10 is from about 50 to about 600 micrometers and the width is from about 1 to about 500 micrometers, in communication with at least one inlet 15 and at least one outlet 16, and a non-etched heat-shrunk thermoplastic cover bonded overtop the thermoplastic base, having at least one inlet 15 and at least one outlet 16 in communication with the microfluidic channel. In one embodiment, the heat-shrunk thermoplastic base comprises a stack of more than one heat-shrunk etched thermoplastic base.

The depth of the microfluidic channels 10 can be easily tailored during the fabrication process. In some embodiments, the thermoplastic material 5 is heated under conditions to achieve microfluidic channels 10 from about 50 to about 600 micrometers. In another embodiment, the thermoplastic material 5 is heated under conditions to achieve microfluidic channels 10 of about 50 micrometers, or alternatively, about 100 micrometers, or alternatively, about 150 micrometers, or alternatively, about 200 micrometers, or alternatively, about 300 micrometers, or alternatively, about 400 micrometers, or alternatively, about 500 micrometers, or alternatively, about 600 micrometers.

For mixing, the thermoplastic receptive material 5 should have one or more inlet 15 channels, wherein the inlet 15 channels meet or intersect at an overlap region that may be in fluid communication with one or more outlet 16 channels, such that a substance, such as a solution, solid or suspension, introduced from the inlet 15 channels are mixed and may proceed to an outlet 16 channel.

It is contemplated that any solution, solid or suspension can be mixed using the mixers disclosed herein, provided that the solid has a particle size sufficiently small to move throughout the mixer.

The methods of this invention fabricate a deep (>50 micrometer) gradient generator chip (FIG. 4A). Mammalian (Chinese Hamster Ovary, CHO) cells can flow through such deep channels 10 (FIG. 4B). The methods of this invention can be used in other well known methods (e.g. Peeters, et al. U.S. Pat. No. 6,926,864, Aug. 9, 2005). Thus, this invention also provides a method to micromix a solution or other material by applying the solution or material to the microfluidic device.

In one aspect, the present invention discloses a method to prepare a textured metal surface 13. These textured metal surfaces or "metal wrinkles" have potential applications in: molecular detection, optical devices, filters and sorters, high-surface area conductors and actuators, and metrology. Disclosed herein are simple and ultra-rapid methods to controllably create complex nano- to micro-scale metal wrinkles on a thermoplastic material 5. Wrinkles have been created with a large range of wavelengths (30×) and periodicity, directionality and aspect ratios, and even patterns.

Metallic thin films and nanostructures exhibit remarkable optical properties which originate in their ability to support coherent electronic oscillations at their interfaces with surrounding dielectric media (Maier, S. A., et al. (2005) *J Appl Phys* 98: 1-10). These supported plasmons can be spatially confined (Localized Surface Plasmon Resonance, LSPR) or free to propagate along the interface boundary (Surface Plasmon Polaritons, SPP). The enhanced electromagnetic fields associated with these modes form the basis of many observed optical phenomena arising from highly enhanced absorption and scattering cross-sections when incident radiation couples to the plasmonic oscillations. These include surface-enhanced Raman scattering (SERS), metal-enhanced fluorescence (MEF), and extraordinary light transmission (Xu, H., et al. (1999) *Phys. Rev. Lett.* 83: 4357-4360, Shuming N., et al. (1997) *Science* 275: 1102-1106, Song, J.-H., et al. (2005) *Nano Lett.* 5: 1557-1561). Exploitation of these and other plasmon-induced effects have benefited numerous applications, including near-field optical microscopy, sub-wavelength photonics, biochemical sensing and solar energy harvesting (Okamoto, K., et al. (2006) *J. Opt. Soc. Am. B* 23: 1674-1678, Ebbesen, T. W., et al. (1998) *Nature* 391: 667-669, Barnes, W. L., et al. (2004) *Phys. Rev. Lett.* 92: 107401-4). In addition to these, SPPs allow directional flow of energy when combined with suitably designed metallic nanostructures to mediate radiative energy transfer over distances of $10^{-4}$-$10^{-7}$ m (Jeffrey N., et al. (2008) *Nature Mater* 7: 442-453, Anthony J., et al. (2008) *Appl. Phys. Lett.* 92: 013504/1-3).

A wide variety of platforms have been used for fabrication of structures capable of supporting plasmonic modes, with the most popular approach being deposition of Au or Ag thin films or nanoparticles (1 and 2D arrays) on inert substrates (Joseph R., et al. (2006) *Appl. Phys. Lett.* 89: 153120/1-3, Anton Kuzyk, et. al., (2007) *Optics Express* 15: 9908-9917, Andrew, P., et al. (2004) *Science* 306: 1002-1005). The techniques used, however, are typically labor intensive nanofabrication and expensive methods such as electron beam lithography and ion beam milling. While there are some effective bottom-up manufacturing approaches using pre-patterned substrates for nanoparticle deposition, such as rippled silicon or faceted alumina, it is believed that there has been no approach as cost-effective and amenable to large-scale production as the one disclosed herein (H. Raether, "Surface Plasmons on Smooth and Rough Surfaces and on Gratings", Springer, Berlin, (1988), Murray, W. A., et al. (2004) *Phys. Rev. B* 69: 165407/1-7).

Disclosed herein is a simple and ultra-rapid technique to controllably create complex nano- to micro-scale patterns on a receptive thermoplastic material 5, such as printable pre-stressed polystyrene (PS) sheets. Because thermoplastic materials 5 contract to a fraction of their size when heated, the mismatch in stiffness between a gold thin film and the carrier thermoplastic material 5 substrate is leveraged. As the thermoplastic material 5 retracts, it carries the stiffer thin metal layer with it, causing the stiffer, non-shrinkable film to buckle or wrinkle (FIG. 8). The methods disclosed herein has been informed by theoretical work that addresses the scaling relationship between the length scales of the wrinkles (wavelengths and amplitudes) and the thickness of the metal film, material properties of the film and substrate and the overall shrinking strain produced (Cerda, E., et al., (2002) Nature, 419: 579-598, Huang, Z., et al., (2004) Phys. Rev. E, 70: 030601). The wrinkle length scales arise from a competition between the elastic bending energy of the film and the elastic energy of deformation of the substrate. By this method, plasmon-active wrinkles are created with a large range of wavelengths (>30x) and periodicity, directionality and aspect ratios, and even patterns. While there have been several demonstrations of metal wrinkles on polymers, all have reported considerably larger wrinkle wavelengths (Yoo P. J., et al., (2002) Adv. Mater., 18:1383-1387, Bowden N, et al., (1999) Appl. Phys. Lett. 75: 2557-2559, Huck W. T. S., et al., (2000) Langmuir 16: 3497-3501 Watanabe M., et al., (2004) J. Polym. Sci. Part B: Polym. Phys. 42: 2460-2466 (2004), Watanabe M., (2005) J. Polym. Sci. Part B: Polym. Phys; 43: 1532-1537, Volynskii A. L., et al., (2000) J. Mater. Sci. 35: 547-554). Using the methods disclosed herein, wrinkles from less than 100 nanometers to greater than 5 microns can be created Because this wrinkled surface demonstrates tunable LSPR resonance, it holds potential as a low cost and robust substrate for surface enhanced sensing and spectroscopy. In addition, because the wrinkles exhibit hierarchical self-assembly, broad band response can be achieved. Moreover, the unidirectional features allow the possibility of energy harvesting and radiative transfer on the same device by SPP.

One aspect of the invention is directed to a method of propagating waves, comprising irradiating a device comprising a heat-shrunk thermoplastic base having a textured metal surface 13, wherein the texture has a height from about 100 nanometers to about 5 micrometers. In another embodiment, the texture has a height from about 50 nanometers to about 5 micrometers, or alternatively, greater than 50 nanometers, or alternatively, about 100 nanometers, or alternatively, about 200 nanometers, or alternatively, about 500 nanometers, or alternatively, about 700 nanometers, or alternatively, about 1 micrometer, or alternatively, about 2 micrometers, or alternatively, about 3 micrometers, or alternatively, about 4 micrometers, or alternatively, less than about 5 micrometers.

Wrinkle height can be controlled by adjusting the metal film thickness. FIG. 17 shows a plot of the maximum average wrinkle height as a function of metal layer thickness. Therefore, one can easily predict the spacing between and height of the metal wrinkles by adjusting the thickness of metal deposited onto the thermoplastic material 5 and the time the thermoplastic material 5 is heated. The thickness of metal deposited onto the thermoplastic material 5 can be easily controlled using the metal deposition methods disclosed herein by adjusting parameters such as time, temperature, and the like. Such methods are well known to one of skill in the art. In certain embodiments, the wavelength of the wrinkles range from about 50 nanometers to about 5 micrometers In addition, the versatile utility of such metal wrinkled structures is demonstrated, as this new substrate demonstrates tunable and polarization-dependent localized surface plasmon resonance (LSPR). It is contemplated that the metal wrinkled structures could prove useful for surface enhanced sensing and spectroscopy. Surprisingly, a polarization-dependent shift in the surface plasmon resonance is observed due to plasmonic coupling along the wrinkle length in the anisotropic case (shown in FIG. 9). Therefore, it is further contemplated that these tunable periodic and anisotropic wrinkles could be used as novel plasmonic substrates to couple with, amongst others, fluorescence molecules (Liu, K., et al. (2007) Microelectronics Journal, 38: 700-705, Song, J.-H., et al., (2005) Nano Lett. 5(8): 1557-1561, Gryczynski, I., et al., (2005) J. Phys. Chem. B. 109: 1088-1093).

Figure 14:
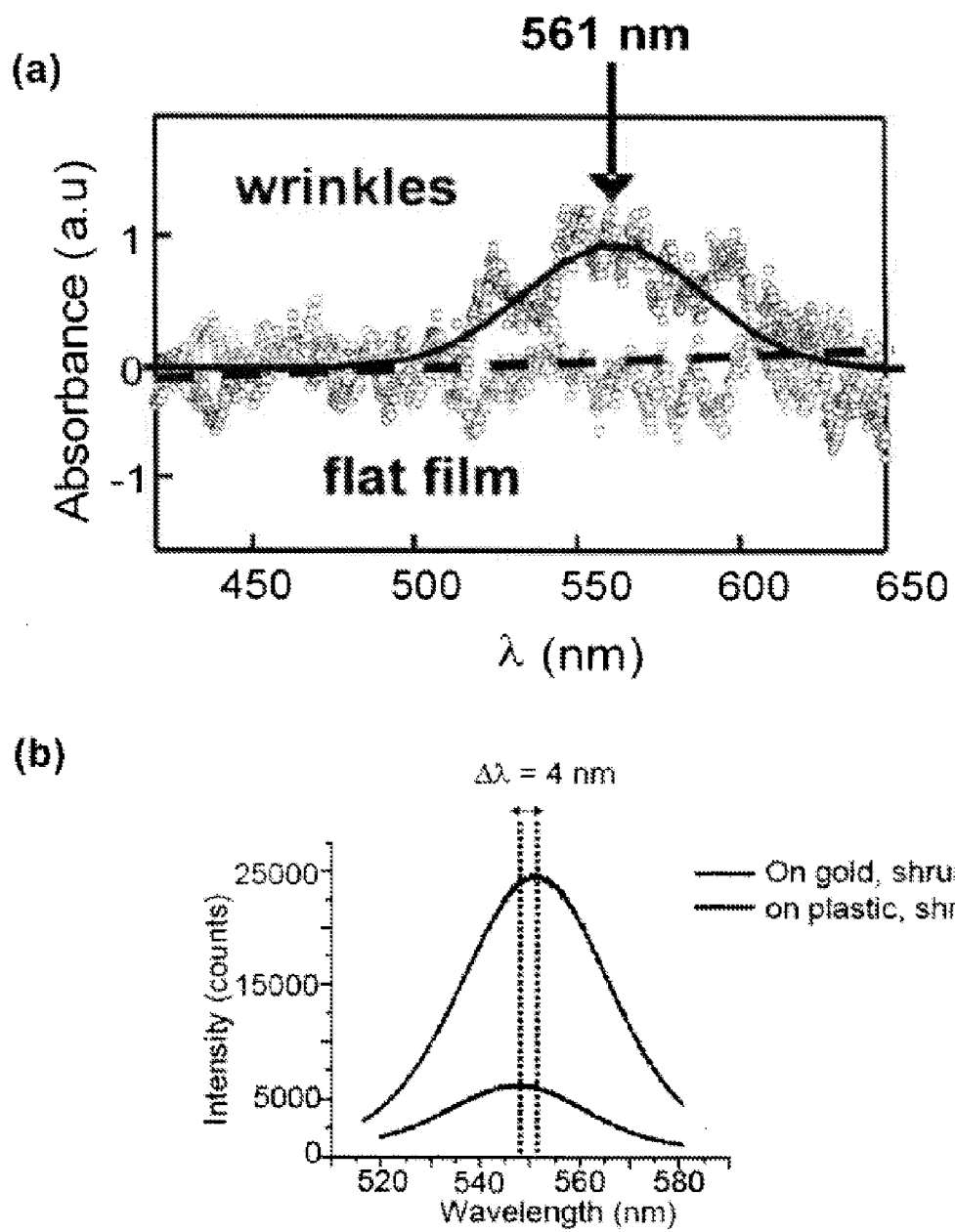
FIG. 14A shows the visible absorption spectra indicating absorption at 561 nanometers for the 30 nanometer thick wrinkles (top line) but no absorption for the flat (unwrinkled) control (bottom line).
FIG. 14B shows a quantum Stark effect as a red shift of the quantum-dot (QD) emission.

For example, FIG. 14A shows data wherein tunable extinction spectra was achieved as a function of substrate structure size. The extinction spectra was measured (the combined effects of absorption and scattering) with a white light source in reflection. In addition, FIG. 14B shows spectrally red-shifted photoluminescence with a change in wavelength of 4 nanometers ($\Delta\lambda=4$ nm) and also shows an enhancement by factors of approximately 5x (measured in the far-field limit) of semiconducting CdSe quantum dots that emit at 588 nanometers.

Figure 15:
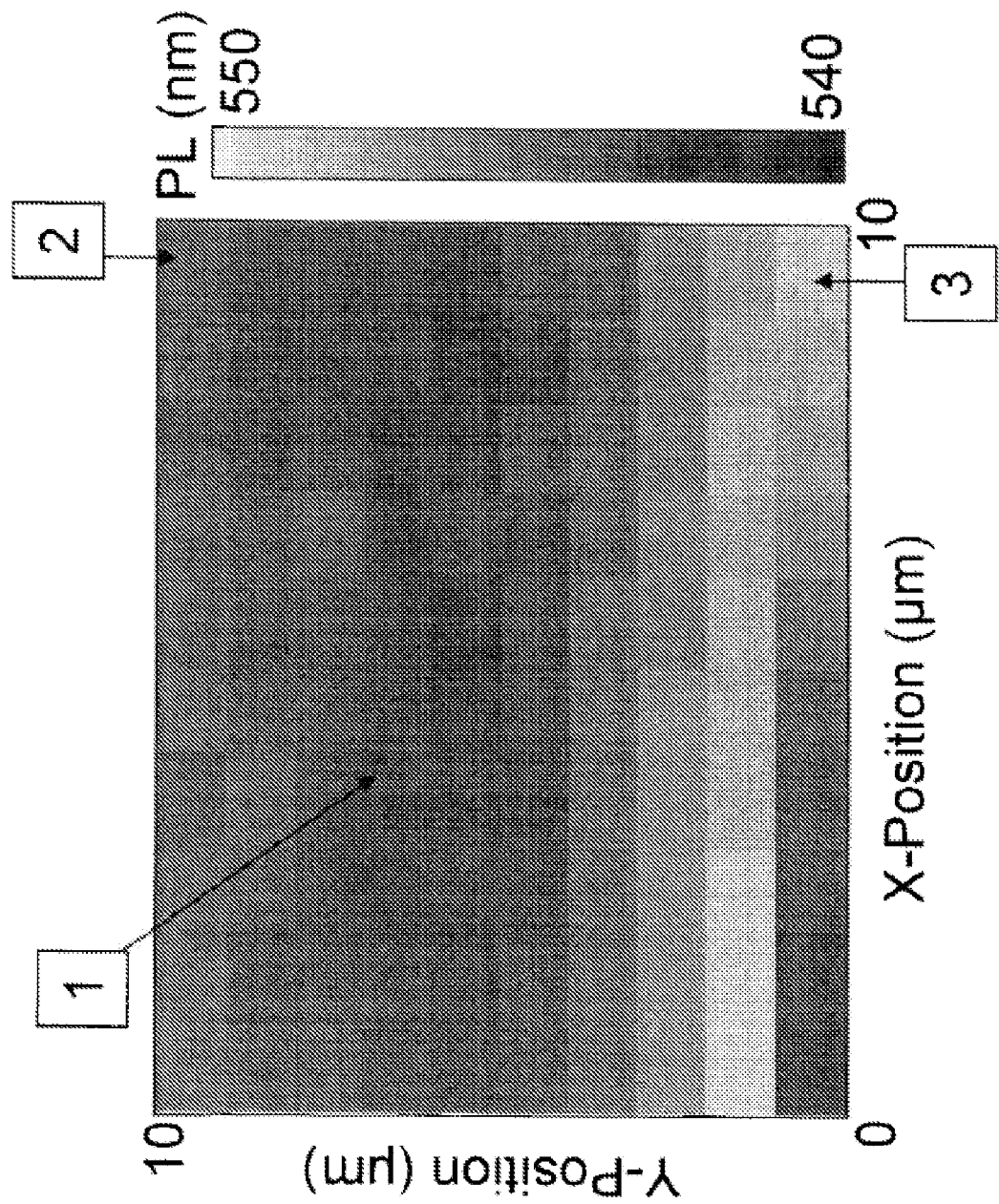
FIG. 15 shows a two dimensional map of the photoluminescence of a 10 by 10 micron sample area of a wrinkled metal surface with a thin layer of quantum dots spun coated on top. The numbered areas shown displays more of a red shift.

Using the device comprising a heat-shrunk thermoplastic base as disclosed herein, clear regions of red-shift in the emission of the quantum dots were observed. The red-shift in emission is dependent on the size of the quantum dots and appears to be a maximum for quantum dots emitting around 588 nanometers in solution. FIG. 15 shows a spatially-resolved photoluminescence 2D map of semiconducting CdSe quantum dots spin-coated onto wrinkled samples of 30 nanometer metal thickness. Further, the spectral shift is accompanied by a change in the recombination lifetime of the excitonic excitations where the decay time is significantly reduced for quantum dots deposited on wrinkled substrates and with red-shifted emission. It is contemplated that these changes in the static and dynamic properties are attributed to both electronic coupling between quantum dots mediated by the structural features reducing inter-dot distances, and the plasmonic coupling between metallic structural features and the quantum dot dipole moments. The latter is supported by the non-monotonic dependence of the spectral red-shift on the size of the quantum dot. It is maximized around the plasmonic absorption in Au.

EXAMPLES

The present technology is further understood by reference to the following examples. The present technology is not limited in scope by the examples, which are intended as illustrations of aspects of the present technology. Any methods that are functionally equivalent are within the scope of the present technology. Various modifications of the present technology in addition to those described herein will become apparent to those skilled in the art from the foregoing description and accompanying figures. Such modifications fall within the scope of the appended claims.

Example 1

Rapid Generation of Deep and Rounded Patterning Devices for Soft Lithography

Microfluidic channels are first designed in AutoCad 2002 (AutoDesk, San Rafael, Calif.). Using a Hewlett-Packard LaserJet 2200D, designs are printed onto the polystyrene thermoplastic sheets (Shrinky Dinks, K &B Innovations, North Lake, Wis.) that resemble transparencies. These thermoplastic sheets are then fed through the printer several times for additional height and/or multi-height channels. The 80 micrometer channel shown in FIG. 1 was double printed using the LaserJet 2200D at 600 dpi. Printers were set to either 600 dpi or 1200 dpi. Counter-intuitively, at 600 dpi, smoother feature edges were achieved, at the expense of channel height. The transparency setting was used for the printer. For multi-layered printing, alignment was ensured by adjusting the printer paper tray such that it tightly fit the thermoplastic sheet. Various printers were tried, including a HP Color LaserJet 2600n and a Samsung ML-2510. The primary difference between the various printers was a slight variation in ink height.

The printed sheet is placed in an oven for 3-5 minutes at 163° Celsius (FIG. 1). Both a standard toaster oven as well as a laboratory-grade oven were tried. Whereas slight warping can result from the toaster over, heating in the pre-heated lab oven resulted in more uniform heating. The devices were heated on a glass microscope slide for even more uniform and flat baking. It was found that the slides should not be pre-heated or they will melt the plastic.

The thermoplastic sheet naturally curls while shrinking. Uniform heat on a flat surface will ensure that the thermoplastic sheet will re-flatten after complete shrinking. A post-bake of 7 minutes in the oven after shrinkage greatly smoothes the ink features, and helps maintain ink adhesion. Devices have been molded over ten times with the same patterning device without any noticeable deterioration in the mold.

The PDMS is poured onto the mold as in typical soft lithography, and cured at 110° Celsius for 10 minutes. The cured PDMS device is then peeled off the mold and bonded using a hand-held corona discharger (Haubert K., et al. (2006) *Lab Chip Technical Note* 6: 1548-1549). The whole process from device design conception to working device can be completed within minutes.

To address the need to create deep and rounded microfluidic channels without expensive and dedicated tooling, a novel method of printing microfluidic channel networks onto a commercially available thermoplastic (Shrinky-Dink) in a standard laser-jet printer is disclosed herein. 'Shrinky-Dinks' are a children's toy onto which one can draw a picture and subsequently shrink it to a small fraction of its original size. It was discovered that when features are printed onto this thermoplastic, after heating for 3-5 minutes at 163° Celsius, the printed features shrink isotropically in plane by approximately 63% from the original printed line width and length. There is an additional corresponding increase in height of the features by over 500%. Therefore, these shrunken features were subsequently used as a rigid mold for soft lithography (Xia Y., et al. (1998) *Annu Rev. Mater. Sci.* 28: 153-84). The thermoplastic mold is thus analogous to the commonly-used silicon wafer, which typically requires photolithographic patterning, for microfluidic applications. Like its silicon wafer counterpart, these plastic molds can be reused numerous times. Unlike the expensive setup and laborious processing required to make the silicon wafers, this approach only requires a laser-jet printer and a toaster oven, and can be completed within minutes. Moreover, multi-height designs within can be achieved the device, which typically requires a laborious and iterative process using standard lithographic approaches.

This invention presents a simple method to fabricate microfluidic channel molds that are inherently rounded. The ability to create molds by printing at a larger scale and then shrinking down more than about 60% by leveraging the inherent property of thermoplastics is demonstrated.

Figure 3:
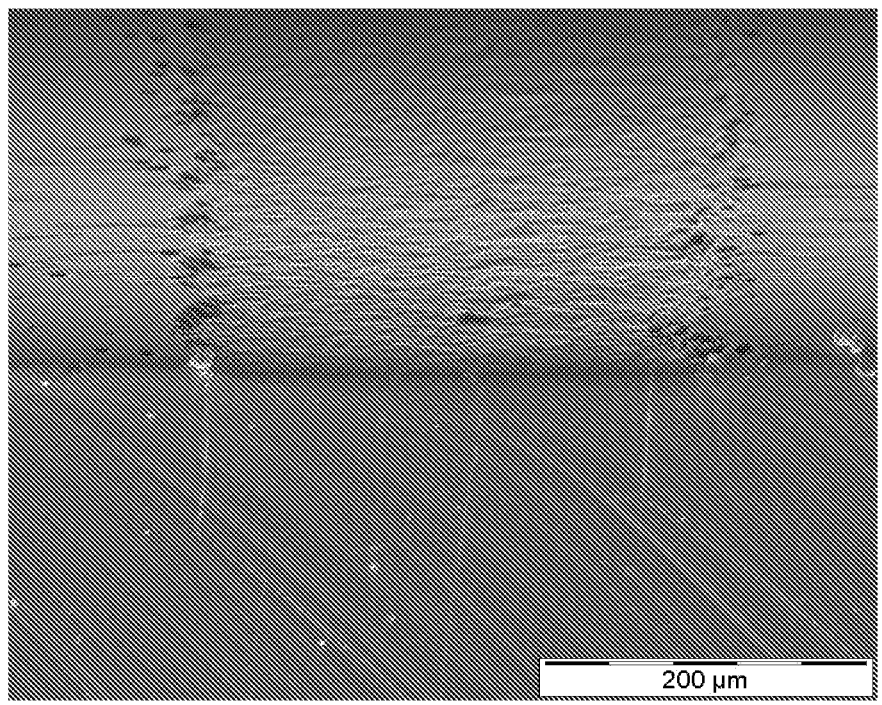
FIG. 3, panels A and B, show scanning electron micrographs (SEM) of channels made from our approach (A) compared to those made using transparencies (B). A) Perspective SEM of channel made using a thermoplastic (Shrinky-Dink) mold versus B) transparency. The difference in height and shape is apparent.
Figure 3:
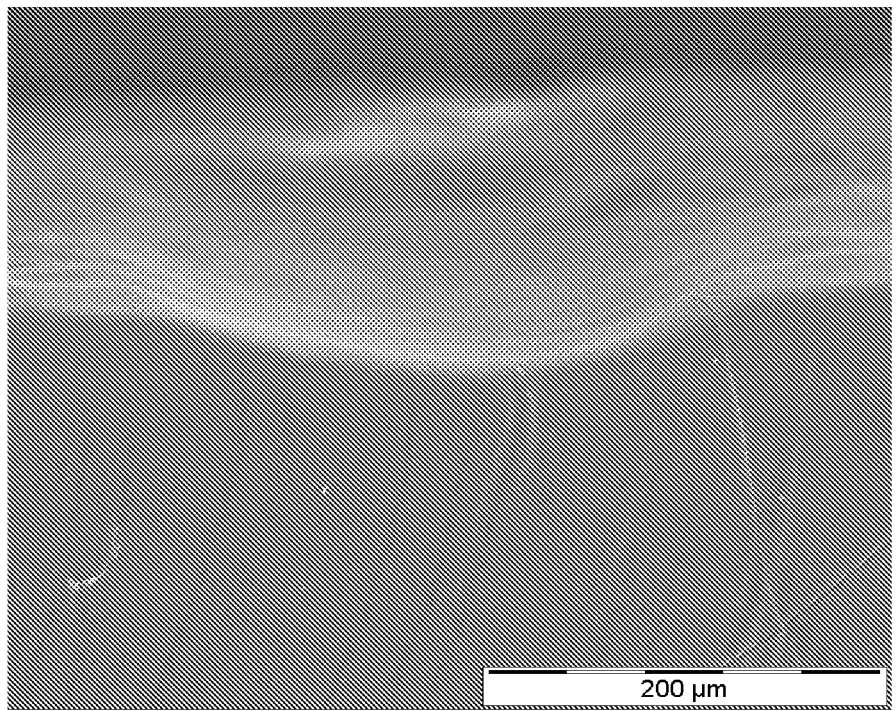

The preformed sheets of thermoplastic, under tension, return to their original size when heated above their transition temperature. In doing so, any printed ink features are also compressed with the constricting substrate. As a feature constricts in length and width, it increases in height. This accounts for the large channel height achievable with this method. The difference in channel height between the printed ink and the constricted, shrunk ink is substantial (FIG. 3a versus 3b). Moreover, rounded channels can be achieved using the methods disclosed herein (FIG. 3).

The minimum line width achieved was 65 micrometers (as verified by SEM, data not shown). This is a function of the printer and it is believed higher resolutions are achievable with more advanced printers. Finally, multiple feature heights can be achieved by re-printing only some of the channels. This is accomplished by feeding the printed sheet back through the printer to selectively double-print certain patterns. In this way, interconnecting channels of different heights or weirs can be easily molded.

In another aspect, in order to fully realize the long-heralded potential of microfluidics for diagnostics, bioanalytical assays, and chemical synthesis, the trade-off between the need to rapidly prototype new and increasingly complex chips without compromising important material properties must be resolved. Material choice is inherently critical as it is common to work with only minute—typically pico nanoliter—volumes and the results of these sensitive assays must be trusted. Although silicon, glass, and quartz have attractive material properties, they require complex processing steps to develop patterns into these substrates (Voldman J., et al. (1999) *Annu. Rev. Biomed. Eng.* 01: 401-425). Whitesides' introduction of the use of polydimethylsiloxane (PDMS) catalyzed exponential progress in the field of microfluidics by enabling rapid prototyping via soft lithography (Whitesides G. M., et al. (2001) *Annu. Rev. Biomed. Eng.* 3: 335-73). Soft lithography accelerates chip fabrication from months (using standard silicon technology) to typically less than 2 days. However, the inherent properties of this polymer material present significant limitations. Many biological hydrophobic molecules absorb easily into the porous PDMS matrix, potentially effecting experimental outcomes, intolerable in many analytical applications Toepke M. W., et al. (2006) *Lab Chip* 6: 1484-1486, J. N., et al. (2004) *Langmuir* 20(26): 11684-11691 and Maltezos G., et al. (2007) *Lab Chip* 7: 1209-1211). Such issues have prevented industry adoption of PDMS for potential applications in drug discovery and other sensitive bio-analytical assays (Mukhopadhyay R., (2007) *Anal Chem.* 79(9): 3248-3253). Thus, PDMS has been relegated largely to academic prototyping. Instead, industry relies on plastics, such as polymethylmethacrylate (PMMA) and polystyrene (PS). Conversely, the high-tooling investments necessary to realize plastic microfluidic chips (e.g., injection molding, hot embossing) has precluded wide spread academic adoption.

A solution to this chasm is presented: a novel technique to rapidly prototype complex microfluidic patterns in polystyrene, which requires no capital investment. This technique, which is even faster than soft lithography, includes a simultaneous rapid bonding step such that complex multi-layered chips can be completed in a matter of minutes.

In essence, thermoplastics (Shrinky-Dinks) are prestressed sheets of polystyrene that retract upon heating (similar to commonly used heat-shrink tubing). This property of the material has been leveraged by engraving channels that are subsequently shrunken to the micro-scale. Features were mechanically etched onto the thermoplastic sheets, and after heating (3-5 minutes at 163° Celsius), the engravings shrank isotropically and in plane by approximately 63% in width and length, and correspondingly increased in height by over 500%. While thermoplastics (Shrinky-Dinks) make effective molds for PDMS, it is also possible to directly pattern the plastics and rapidly bond them for functional devices, eliminating several fabrication steps as well as the need for PDMS altogether. Strong bonding can be achieved by heating the patterned and unshrunk polystyrene sheet on top of another unshrunk sheet to their glass transition temperature (163° C.) for irreversible cross-linking In this way, stacked chips are fabricated, in which microfluidic channels traverse several layers. Using a simple scribing approach, channels as thin as 8 micrometers are achieved, with controllable channel depths (from 50-600 micrometer) dependent on applied scribing pressure. Moreover, by choice of scribe, the shape of the channels can be altered (FIG. 5). One can imagine that this is easily adaptable to computer-controlled plotters that directly write patterns onto the pre stressed thermoplastic sheets.

The ability to rapidly, easily, and inexpensively create 2-D or 3-D plastic microfluidic chips will enable researchers of all academic fields, even with no engineering backgrounds, to design devices specific to their needs. In addition, elimination of the need for PDMS greatly increases the range of applications for which these microfluidic chips can be utilized. Combining simple and rapid fabrication, three dimensional complexity, and chemical compatibility will undoubtedly help usher microfluidics from the prototyping stage to its full potential of miniaturized system for addressing critical biomedical issues.

Example 2

Rapid Generation of Deep and Rounded Patterning Devices for Soft Lithography using Metal Deposition Methods Metals are deposited onto the shrinkable thermoplastic by either thermal evaporation or sputtering. Pieces of unshrunk plastic are placed in either the sputter coater or evaporator and vacuumed down. Target metal is deposited onto the plastic. The thickness, or height of the deposited metal is dependent on length of processing time. The plastic substrate should be far enough from the source such that the plastic does not heat up during deposition. A wide range of thicknesses, or heights, of deposited metal are accomplished, from about 5 nanometers to about 90 nanometers.

After the metal is deposited on the thermoplastic, it is placed in the oven to shrink, as previously described. Upon heating, because of the stiffness incompatibility between the metal and the shrinking thermoplastic, wrinkles form (FIG. 6A to 6D). The spacing between the wrinkles can be controlled by the amount of heating, and hence shrinkage. In addition, the directionality of the wrinkles can be controlled by grooving the substrate prior to metal deposition. Finally, the periodicity of the wrinkle as the wavelength of the wrinkles scale according to the thickness to the ¾th power. Therefore, tighter wrinkles are achieved by changing the thickness, or height of the metal layer.

Example 3

Efficient Mixing at Low Reynolds Numbers Using a 3 Dimensional Micro-Mixer

Rapid homogeneous micro-mixing was demonstrated at low Reynolds numbers in an easily fabricated 3D polystyrene vortex micro-mixer. Micro-mixing is critically important for miniaturized analysis systems. However, rapid and effective mixing at these small scales remains a persistent challenge. The performance of the micro-mixer disclosed herein has been compared against the 2D serpentine design (Derringer, S. K., et al. (2001) Anal. Chem. 73: 1240) by examining its effectiveness in mixing dissimilar solutions and suspensions. Numerical simulations confirm the experimental observations and provide insights on the self-rotational mixing dynamics achieved with the simple geometry disclosed herein at low Reynolds numbers. We disclose herein a rapid, robust, and easily fabricated micro-mixer amenable to large-scale integration.

The design disclosed herein is remarkably simple, yet effective. With device dimensions similar to those of other studies (Lin, C. H., et al. (2005) *Micromech. Microeng.* 15: 935) homogenous and rapid mixing using a geometrically simple and easily fabricated design is disclosed. The numerical simulations confirm the experimental observations that vortex formation can be achieved with just one inlet channel, one vertical drop, and one outlet channel (FIG. 10). One aspect of the utility of such a 3D chip is demonstrated by comparing its mixing enhancements over traditional 2D serpentine mixing. Because this approach requires no photolithography and has minimal chip 'footprint' area (Chen, C. S., et al. (2008) *Lab Chip* 8: 622) the 3D micro-mixer is amenable to large-scale integration in which these mixers can be arrayed readily in parallel.

The micro-mixers are provided using the methods disclosed herein. Briefly, the pattern designs are mechanically etched on the thermoplastic material (Shrinky-Dink), which are biaxially pre-stressed polystyrene sheets (Grimes, A., et al. (2008) Lab Chip 8: 170). After heating the polystyrene sheet to its transition temperature, the engraved microchannels shrink in plane by approximately 60% and correspondingly increase in height by over 700%. A more detailed description of the fabrication is described hereinabove.

To compare mixing efficiency, mixing in both 2D serpentine and 3D vortex mixers (FIG. 11) was tested. For each mixer, water diluted with two different concentrations of blue dye (McCormick Dye, Inc.) is added to the micro-mixer using a syringe pump (KD Scientific). Volumetric flow rates (Q) (vortex range: 5-1000 μl/min; serpentine range: 0.83-166.5 μl/min) that correspond to Re of 0.1 to 55 (where Re=Q/D v, D is the hydraulic diameter of the inlet channel, and v is the kinematic viscosity, taken here as $1.156 \times 10^{-6}$ m$^2$/s) were used. Each mixed solution was collected in their respective branched outlet channel. The absorption optical density of the solutions was quantified using a photometric microplate absorbance reader (Multiskan EX, Thermo Electron). The mixing efficiency was defined to be one minus the difference in intensity of the outlets divided by the difference in intensity of the inlets. Therefore, since two unmixed solutions were used, a value of 0 would indicate the poorest mixing efficiency and a value of 1 would indicate the best.

Figure 11:
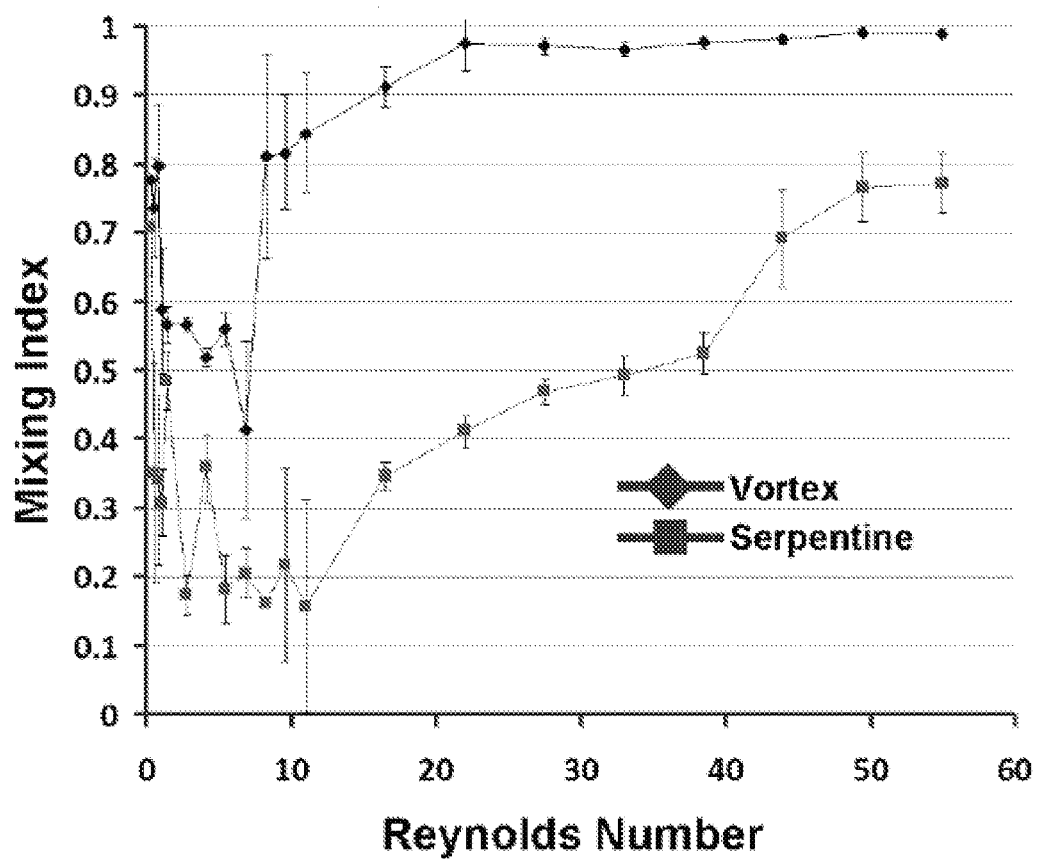
FIG. 11 shows a graph which quantifies the mixing effectiveness as a function of Reynolds Number (Re) for both the vortex micro-mixer and the serpentine mixer. The error bars represent the standard error of the mean.

As shown in FIG. 11, enhanced mixing efficiency was found using the vortex mixer, and mixing efficiency of the vortex micro-mixer was found to be better than the serpentine channel at all Re numbers tested. Also, compared to the mixing efficiency fluctuations in the serpentine mixer, the mixing efficiency of the 3D vortex micro-mixer was found to be more stable at different flow rates. Notably, the 'good' mixing in both designs at extremely low Re is because the mixing was allowed as much time as necessary for a given flow rate, and only the constant volume that we collected from the chip measured.

Figure 12:
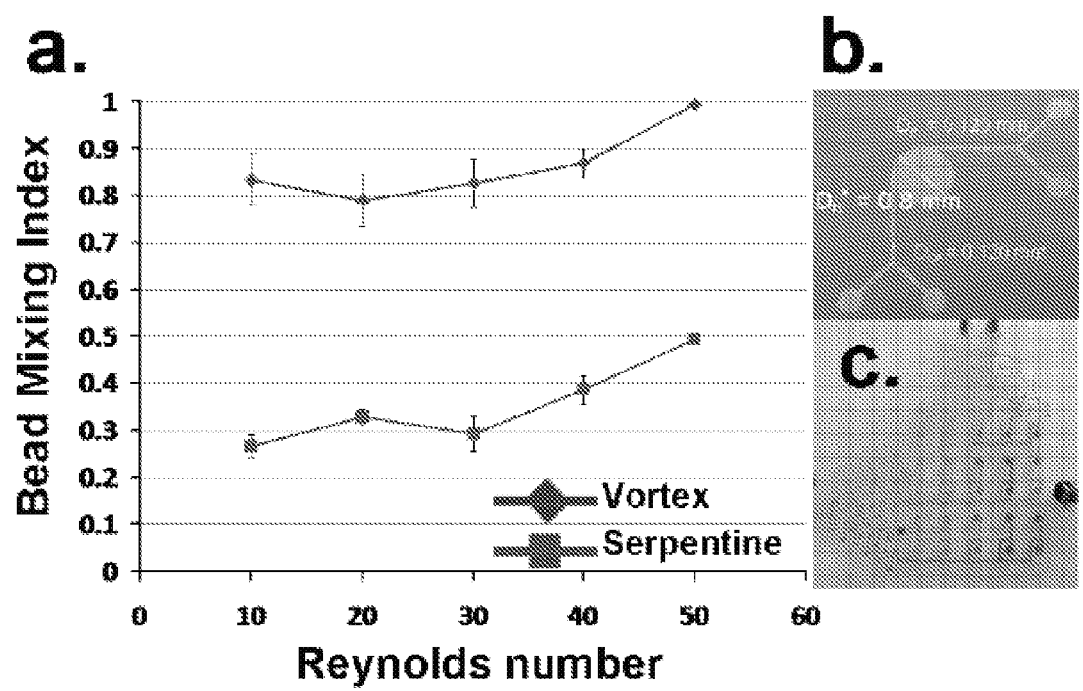
FIG. 12A shows a graph of bead redistribution using a smaller microvortex mixer. The dimensions are illustrated in FIG. 12B.
FIG. 12C shows a 5×5 array of micro-mixers integrated into gradient generators.

Suspension mixing of large particles was demonstrated by using fluorescent 10 pm polystyrene beads (Bangs Laboratories, Inc.). Beads were flowed into one inlet channel with non-fluorescent aqueous solution in the other. Ideal mixing would result in redistribution of beads such that each outlet channel has the same fluorescent intensity. The fluorescence intensity distribution was compared in the collection channels at various Re numbers by changing the flow rates. Again, a significant improvement is observed, as shown in FIG. 12, compared to the 2D serpentine design.

From the experimental data (FIGS. 11 and 12), the mixing efficiency of the vortex micro-mixer is significantly better than the serpentine channel at all Re numbers tested. The geometrically simple design complemented by ease in fabrication of the low cost and industry-accepted plastic substrate material provides for high-density-layout potential. This would enable the rapid processing of different chemical reactions in parallel arrays on a small chip area (FIG. 12C). Such mixing is critical for applications in—amongst others—point-of-care diagnostic chips, where the rapid and homogenous mixing of reagents and specimens in small volumes is critical.

While the present invention is exemplified and illustrated by the use of polystyrene sheets to fabricate channel structures and molds, it would be obvious to those of skill in the art that any thermoplastic receptive material that can be patterned to control the dimensions of the channel defining walls and thereby their size, can be used to fabricate the devices disclosed and claimed herein. In addition, although several other embodiments of the invention are described herein in detail, it will be understood by those skilled in the art that variations may be made thereto without departing from the spirit of the invention or the scope of the appended claims.

What is claimed is:

1. A method to prepare a textured metal surface, comprising the steps of:
   a) depositing a metal film onto a heat sensitive thermoplastic receptive material; and
   b) reducing the heat sensitive thermoplastic receptive material with the metal film deposited thereon in plane with respect to at least one of width and length, by at least about 60%, wherein the metal film deposited on the heat sensitive thermoplastic receptive material forms wrinkles having a height or thickness, wherein a height or thickness of the wrinkles is over 500% the thickness of the metal film deposited on the heat sensitive thermoplastic receptive material prior to reducing in plane with respect to at least one of width and length;
   thereby preparing a textured metal surface.

2. The method of claim 1, wherein the heat sensitive thermoplastic receptive material is uni-axially biased prior to performing steps a) and b).

3. The method of claim 1, wherein the metal film is deposited by sputter coating, evaporation or chemical vapor deposition.

4. The method of claim 1, wherein the metal film is deposited in a thickness from about 2 nanometers to about 100 nanometers.

5. The method of claim 1, wherein the metal film comprises one or more of the group of silver, gold or copper.

6. The method of claim 1, wherein the heat sensitive thermoplastic receptive material is reduced to achieve a surface texture in the range of from about 100 nanometers to about 5 micrometers.

7. The method of claim 1, wherein the heat sensitive thermoplastic receptive material is polystyrene.

8. The method of claim 1, wherein the metal film is deposited in a desired pattern.

9. The method of claim 1, wherein the heat sensitive thermoplastic receptive material is reduced by heating.

* * * * *